(12) United States Patent
Choi et al.

(10) Patent No.: US 12,040,020 B2
(45) Date of Patent: Jul. 16, 2024

(54) MEMORY DEVICE, METHOD OF OPERATING THE SAME, AND METHOD OF OPERATING STORAGE DEVICE INCLUDING THE SAME

(71) Applicant: SAMSUNG ELECTRONICS CO., LTD., Suwon-si (KR)

(72) Inventors: Kwangho Choi, Suwon-si (KR); Minseok Kim, Hwaseong-si (KR); Il Han Park, Suwon-si (KR); Jun-Yong Park, Seoul (KR); Joonsuc Jang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 198 days.

(21) Appl. No.: 17/854,163

(22) Filed: Jun. 30, 2022

(65) Prior Publication Data

US 2023/0144659 A1     May 11, 2023

(30) Foreign Application Priority Data

Nov. 5, 2021   (KR) .................. 10-2021-0151801

(51) Int. Cl.
| | |
|---|---|
| *G11C 16/10* | (2006.01) |
| *G11C 16/04* | (2006.01) |
| *G11C 16/08* | (2006.01) |
| *G11C 16/12* | (2006.01) |
| *G11C 16/26* | (2006.01) |

(52) U.S. Cl.
CPC .......... *G11C 16/0433* (2013.01); *G11C 16/08* (2013.01); *G11C 16/12* (2013.01); *G11C 16/26* (2013.01)

(58) Field of Classification Search
CPC ........................................................ G11C 7/14
USPC ..................................................... 365/210.1
See application file for complete search history.

(56) References Cited

U.S. PATENT DOCUMENTS

| | | |
|---|---|---|
| 6,842,384 B2 | 1/2005 | Lee |
| 7,196,965 B2 | 3/2007 | Han et al. |
| 9,349,471 B2 | 5/2016 | Yun |
| 9,437,314 B2 | 9/2016 | Shin |
| 10,157,676 B2 | 12/2018 | Pang et al. |
| 10,629,281 B2 | 4/2020 | Kim et al. |
| 10,998,052 B2 | 5/2021 | Lee et al. |

(Continued)

FOREIGN PATENT DOCUMENTS

CN           110235111 A      9/2019

*Primary Examiner* — Jason Lappas
(74) *Attorney, Agent, or Firm* — Muir Patent Law, PLLC

(57) ABSTRACT

Disclosed is a memory device which includes a history table and communicates with a storage controller. A method of operating the memory device includes receiving a first request indicating a first core operation of a first memory block from the storage controller, determining whether history data of the first memory block have a first value or a second value, with reference to the history table, in response to the first request, when it is determined that the history data of the first memory block have the first value, performing the first core operation corresponding to a first type on the first memory block, and after performing the first core operation corresponding to the first type on the first memory block, updating the history data of the first memory block in the history table from the first value to the second value.

20 Claims, 16 Drawing Sheets

(56) References Cited

U.S. PATENT DOCUMENTS 11,016,705 B2    5/2021   Zhang et al.
2019/0171381 A1* 6/2019   Ioannou ................ G06F 3/0679

* cited by examiner

FIG. 6
1. Normal Case (e.g. subsequent core operation of touched block)
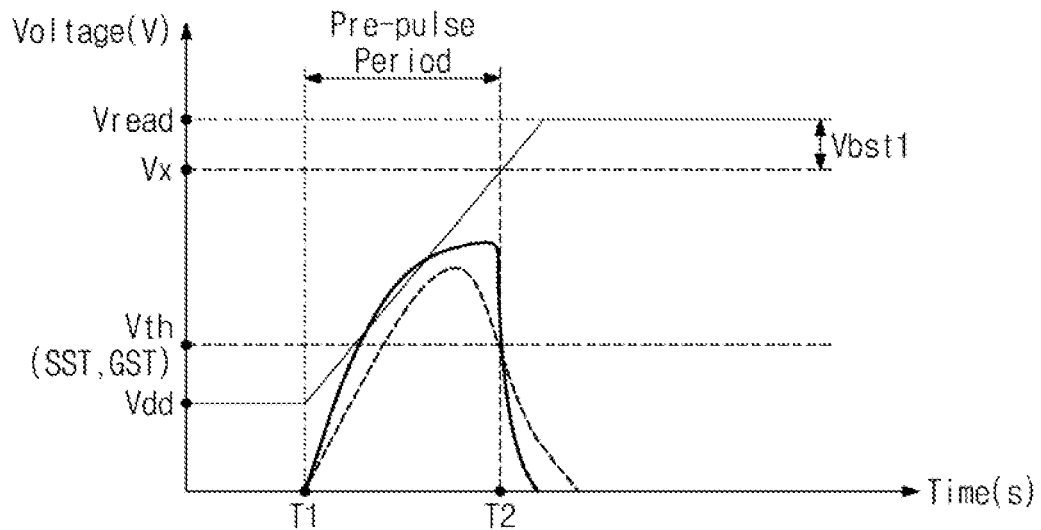
2. Abnormal Case (e.g. initial core operation of untouched block)
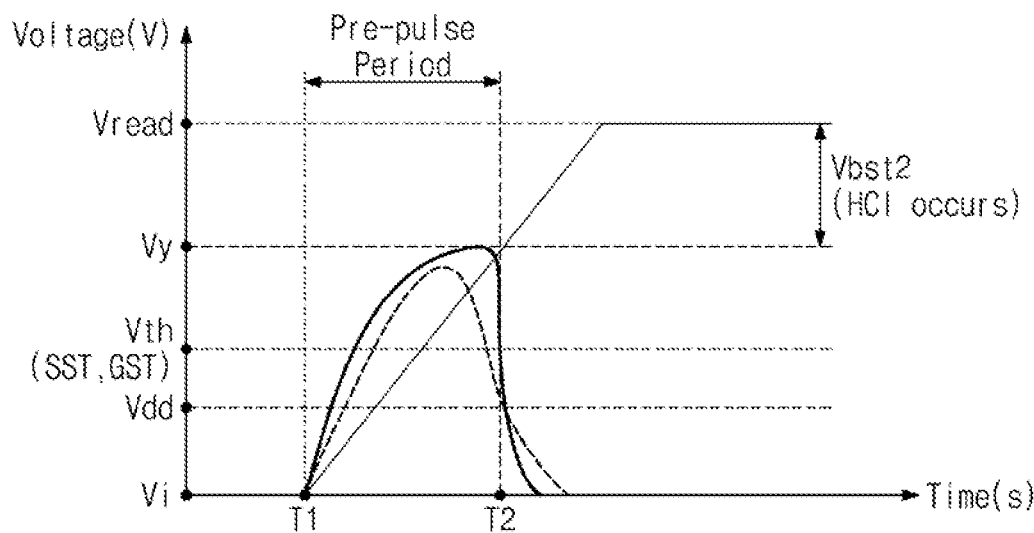

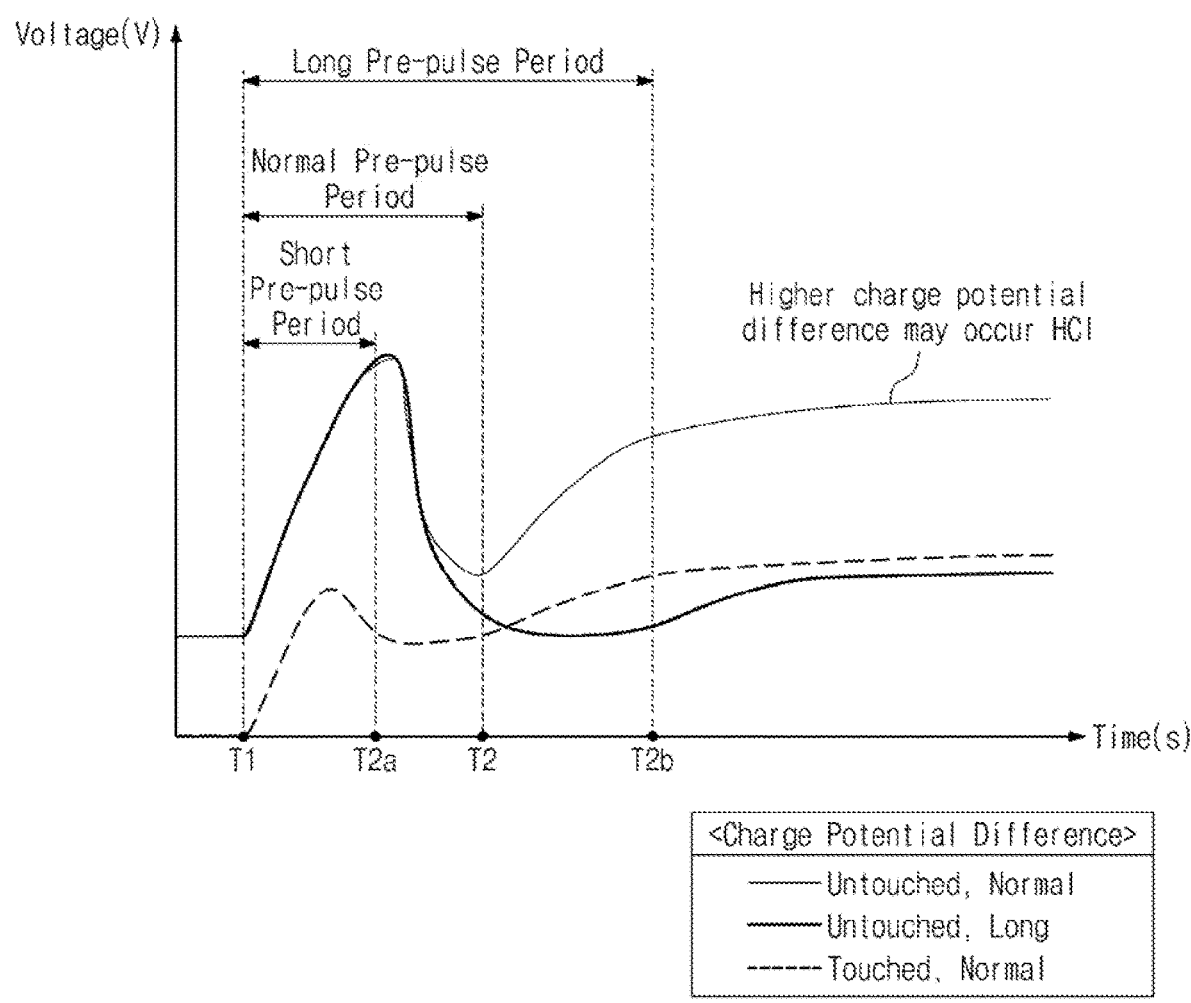

FIG. 9

<History Table> 122

| Table Index | BLK Index | History Data | Comment | Core Operation Type |
|---|---|---|---|---|
| 1 | 302 | 0 | Touched | 2nd type (Short pre-pulse, lower voltage level) |
| 2 | 150 | 0 | Touched | 2nd type (Short pre-pulse, lower voltage level) |
| 3 | 500 | 0 | Touched | 2nd type (Short pre-pulse, lower voltage level) |
| 4 | 30 | 0 | Touched | 2nd type (Short pre-pulse, lower voltage level) |
| 5 | - | 1 | Untouched | 1st type (Long pre-pulse, higher voltage level) |
| 6 | - | 1 | Untouched | 1st type (Long pre-pulse, higher voltage level) |
| ... | ... | ... | ... | ... |
| M-2 | - | 1 | Untouched | 1st type (Long pre-pulse, higher voltage level) |
| M-1 | - | 1 | Untouched | 1st type (Long pre-pulse, higher voltage level) |
| M | - | 1 | Untouched | 1st type (Long pre-pulse, higher voltage level) |

FIG. 10

<History Table> 122

| Table index | BLK Index | History Data | Comment | Update Order | Reference Order |
|---|---|---|---|---|---|
| 1 | 231 | 0 | Touched | M+1 | 1 |
| 2 | 56 | 0 | Touched | M+2 | 1 |
| 3 | 500 | 0 | Touched | 3 | 8 |
| 4 | 30 | 0 | Touched | 4 | 1 |
| 5 | 125 | 0 | Touched | 5 | 1 |
| 6 | 457 | 0 | Touched | 6 | 3 |
| ... | ... | ... | ... | ... | ... |
| M | 41 | 0 | Touched | M | 1 |

Determine BLK index to be emptied based on update order and reference count

MEMORY DEVICE, METHOD OF OPERATING THE SAME, AND METHOD OF OPERATING STORAGE DEVICE INCLUDING THE SAME

CROSS-REFERENCE TO RELATED APPLICATION

This application claims priority under 35 U.S.C. § 119 to Korean Patent Application No. 10-2021-0151801 filed on Nov. 5, 2021, in the Korean Intellectual Property Office, the disclosures of which are incorporated by reference herein in their entireties.

BACKGROUND

1. Field

Embodiments relate to a memory device, a method of operating the same, and a method of operating a storage device including the same.

2. Description of the Related Art

A memory device stores data in response to a write request and outputs data stored therein in response to a read request. For example, the memory device is classified as a volatile memory device, which loses data stored therein when a power supply is turned off, such as a dynamic random access memory (DRAM) device or a static RAM (SRAM) device, or a non-volatile memory device, which retains data stored therein even when a power supply is turned off, such as a flash memory device, a phase-change RAM (PRAM), a magnetic RAM (MRAM), or a resistive RAM (RRAM). The non-volatile memory device may include a plurality of memory cells.

SUMMARY

According to an embodiment, a memory device includes a history table and communicates with a storage controller. A method of operating the memory device includes receiving a first request indicating a first core operation of a first memory block from the storage controller, determining whether history data of the first memory block have a first value or a second value, with reference to the history table, in response to the first request, when it is determined that the history data of the first memory block have the first value, performing the first core operation corresponding to a first type on the first memory block, and after performing the first core operation corresponding to the first type on the first memory block, updating the history data of the first memory block in the history table from the first value to the second value.

According to an embodiment, a storage device includes a memory device including a history table and a storage controller communicating with the memory device. A method of operating the storage device includes providing, by the storage controller, a request indicating a core operation of a target memory block of the memory device, determining, by the memory device, whether history data of the target memory block have a first value or a second value, with reference to the history table, in response to the request, performing, by the memory device, the core operation corresponding to a first type on the target memory block, when it is determined that the history data of the target memory block have the first value, and updating, by the memory device, the history data of the target memory block in the history table from the first value to the second value, after performing the core operation corresponding to the first type on the target memory block.

According to an embodiment, a memory device includes a memory cell array that includes a plurality of memory blocks, a history table that manages history data of at least some of the plurality of memory blocks, and control logic. The control logic receives a core operation of a target memory block of the plurality of memory blocks, determines whether history data of the target memory block have a first value or a second value, with reference to the history table, in response to the request, updates the history data of the target memory block in the history table from the first value to the second value after performing the core operation corresponding to a first type on the target memory block, when it is determined that the history data of the target memory block have the first value, and performs the core operation corresponding to a second type different from the first type on the target memory block, when it is determined that the history data of the target memory block have the second value.

BRIEF DESCRIPTION OF THE DRAWINGS

Features will become apparent to those of skill in the art by describing in detail example embodiments with reference to the attached drawings in which:

FIG. 6 is a diagram describing an initial core operation and a subsequent core operation according to some example embodiments.

FIG. 8 is a graph describing a charge potential difference according to some example embodiments.

FIG. 9 is a diagram illustrating a history table of FIG. 7 in detail, according to some example embodiments.

FIG. 10 is a diagram illustrating a history table of FIG. 7 in detail, according to some example embodiments.

DETAILED DESCRIPTION

Figure 1:
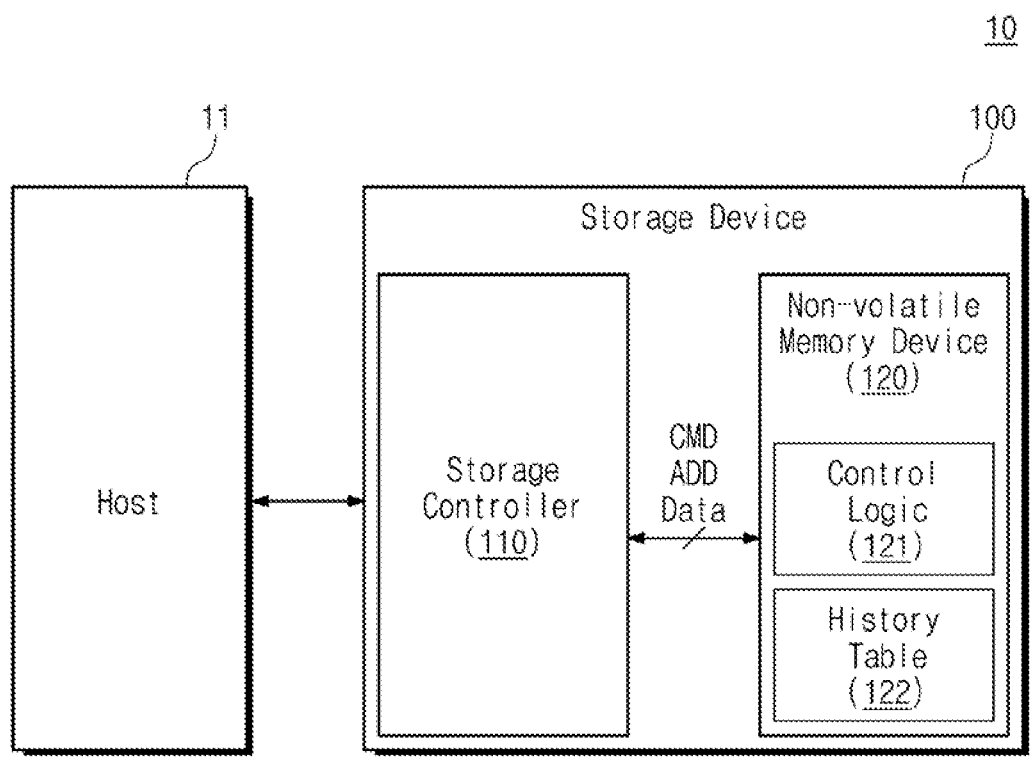
FIG. 1 is a block diagram of a storage system according to an example embodiment.

FIG. 1 is a block diagram of a storage system according to an example embodiment.

Referring to FIG. 1, a storage system 10 may include a host 11 and a storage device 100. In some example embodiments, the storage system 10 may be a computing system that is configured to process a variety of information, such as a personal computer (PC), a notebook, a laptop, a server, a workstation, a tablet PC, a smartphone, a digital camera, and a black box.

The host 11 may control an overall operation of the storage system 10. For example, the host 11 may store data in the storage device 100 or may read data stored in the storage device 100.

The storage device 100 may include a storage controller 110 and a non-volatile memory device 120. The non-volatile memory device 120 may store data. The storage controller 110 may store data in the non-volatile memory device 120 or may read data stored in the non-volatile memory device 120. The non-volatile memory device 120 may operate under control of the storage controller 110. For example, based on a command CMD indicating an operation and an address ADD indicating a location of data, the storage controller 110 may store the data in the non-volatile memory device 120 or may read the data stored in the non-volatile memory device 120.

In some example embodiments, the non-volatile memory device 120 may be a NAND flash memory device or one of various storage devices that retain data stored therein even though a power is turned off, such as a phase-change random access memory (PRAM), a magnetic random access memory (MRAM), a resistive random access memory (RRAM), and a ferroelectric random access memory (FRAM).

The non-volatile memory device 120 may include control logic 121 and a history table 122.

The control logic 121 may control a core operation, such as a read operation, a program operation, or an erase operation, based on the command CMD and the address ADD. The read operation may refer to an operation of reading data stored in the non-volatile memory device 120. The program operation may refer to an operation of storing data by changing threshold voltage levels of memory cells in the non-volatile memory device 120 to a programming voltage level(s). The erase operation may refer to an operation of removing stored data by changing threshold voltage levels of the memory cells in the non-volatile memory device 120 to an erase voltage level.

The control logic 121 may receive the command CMD and the address ADD from the storage controller 110. The command CMD and the address ADD may also be called a request indicating the core operation.

The history table 122 may manage history data of the non-volatile memory device 120. For example, when the non-volatile memory device 120 is powered on or is reset, all the history data of the history table 122 may be initialized. The non-volatile memory device 120 may include a plurality of memory blocks storing data. The history data may indicate whether the core operation is performed in units of memory block after the non-volatile memory device 120 is powered on or is reset. In another implementation, the history table 122 may manage history data on some of the memory blocks of the non-volatile memory device 120, and the history data may indicate whether the core operation is performed based on various sizes of memory cell sets, as well as in units of memory block.

According to some example embodiments, the control logic 121 may determine a type of the core operation with reference to the history table 122. For example, the control logic 121 may receive a request indicating the core operation of a target memory block from the storage controller 110. The target memory block may be a memory block in which the core operation is to be performed. The control logic 121 may perform the following operations with reference to the history table 122: a first type of core operation when the history data of the target memory block has a first value (e.g., "1") and a second type of core operation when the history data of the target memory block has a second value (e.g., "0"). After performing the first type of core operation on the target memory block, the control logic 121 may update the history data of the target memory block in the history table 122 from the first value to the second value. This will be described in detail with reference to FIGS. 7 and 14.

In some example embodiments, the storage controller 110 may reset the non-volatile memory device 120 based on an internal operation condition or an external request. For example, the storage controller 110 may determine whether to reset the non-volatile memory device 120, based on the internal operation condition according to firmware or a request of the host 11.

Figure 2:
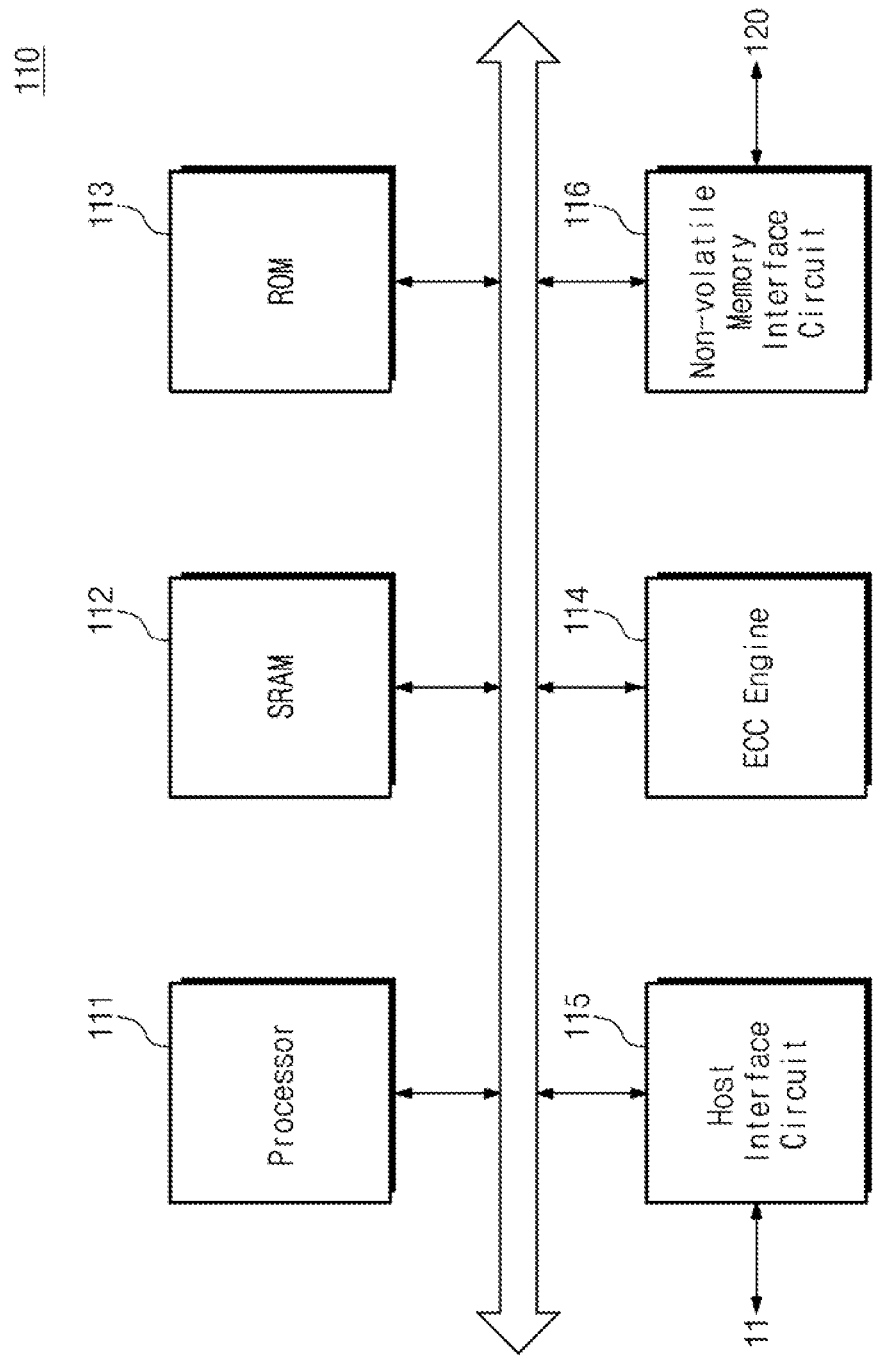
FIG. 2 is a block diagram illustrating a storage controller of FIG. 1 in detail, according to some example embodiments.

FIG. 2 is a block diagram illustrating a storage controller of FIG. 1 in detail, according to some example embodiments.

Referring to FIGS. 1 and 2, the storage controller 110 may communicate with the host 11 and the non-volatile memory device 120. The storage controller 110 may include a processor 111, a static random access memory (SRAM) 112, a read only memory (ROM) 113, an error correcting code (ECC) engine 114, a host interface circuit 115, and a non-volatile memory interface circuit 116.

The processor 111 may control an overall operation of the storage controller 110.

The SRAM 112 may be used as a buffer memory, a cache memory, or a working memory of the storage controller 110. In some example embodiments, the SRAM 112 may be a firmware memory that stores instructions indicating a method of operating the storage controller 110, and the instructions may be executed by the processor 111.

The ROM 113 may be used as a read only memory storing information used for the operation of the storage controller 110.

The ECC engine 114 may detect and correct an error of data read from the non-volatile memory device 120.

The storage controller 110 may communicate with the host 11 through the host interface circuit 115. In some example embodiments, the host interface circuit 115 may be implemented based on at least one of various interfaces such as a serial ATA (SATA) interface, a peripheral component interconnect express (PCIe) interface, a serial attached SCSI (SAS), a nonvolatile memory express (NVMe) interface, and a universal flash storage (UFS) interface.

The storage controller 110 may communicate with the non-volatile memory device 120 through the non-volatile memory interface circuit 116. In some example embodiments, the non-volatile memory interface circuit 116 may be implemented based on a NAND interface.

Figure 3:
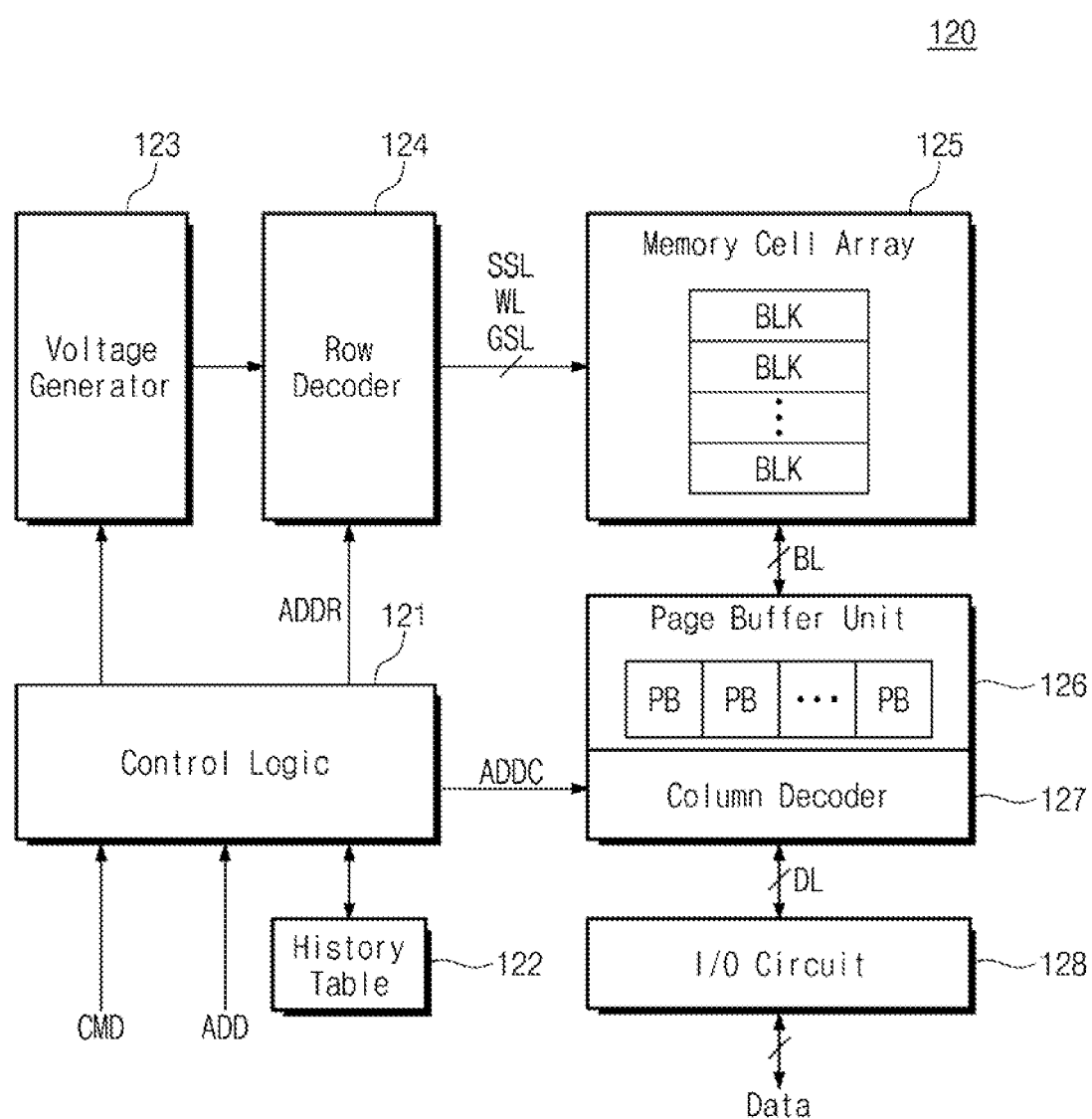
FIG. 3 is a block diagram illustrating a non-volatile memory device of FIG. 1 in detail, according to some example embodiments.
Figure 4:
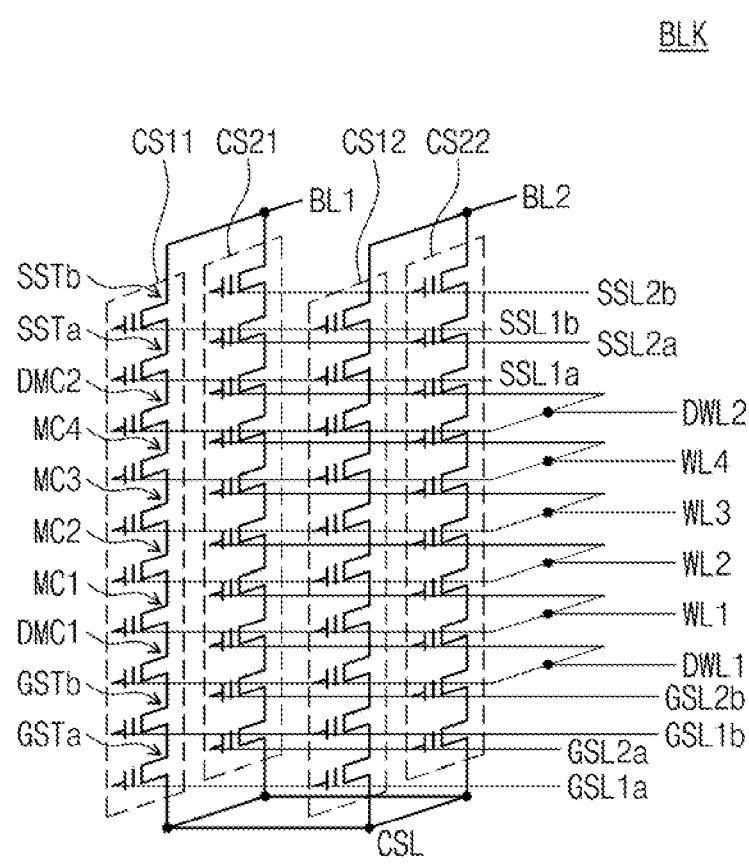
FIG. 4 is a diagram describing a memory block of a memory cell array of FIG. 3, according to some example embodiments.

FIG. 3 is a block diagram illustrating a non-volatile memory device of FIG. 1 in detail, according to some example embodiments. FIG. 4 is a diagram describing a memory block of a memory cell array of FIG. 3, according to some example embodiments.

Referring to FIGS. 1, 3, and 4, the non-volatile memory device 120 may communicate with the storage controller 110. For example, the non-volatile memory device 120 may receive the address ADD and the command CMD from the storage controller 110. The non-volatile memory device 120 may exchange data with the storage controller 110.

The non-volatile memory device 120 may include the control logic 121, the history table 122, a voltage generator 123, a row decoder 124, a memory cell array 125, a page buffer unit 126, a column decoder 127, and an input/output (I/O) circuit 128.

The control logic 121 may receive the command CMD and the address ADD from the storage controller 110. The command CMD may refer to a signal indicating the core operation to be performed by the non-volatile memory device 120, such as a read operation, a program operation, or an erase operation. The address ADD may indicate a location of memory cells in which the core operation is to be performed. The control logic 121 may generate a row address ADDR and a column address ADDC based on the address ADD. The command CMD and the address ADD may constitute a request indicating the core operation associated with a target memory block.

The history table 122 may manage history data of each of a plurality of memory blocks BLK of the memory cell array 125. For example, the history data may indicate whether the core operation is performed on the corresponding memory block BLK after an initial operation such as a power-on operation or a reset operation. For example, when the history data have the first value, the corresponding memory block BLK may be a memory block (i.e., an untouched memory block or a memory block in an untouched state) on which the core operation is not performed. When the history data have the second value, the corresponding memory block BLK may be a memory block (i.e., a touched memory block or a memory block in a touched state) on which the core operation is performed.

In some example embodiments, the control logic 121 may determine a type of the core operation to be performed on a target memory block as a first type or a second type, with reference to the history table 122. The core operation of the first type may be performed on an untouched memory block. The core operation of the second type may be performed on a touched memory block. The first type and the second type may be different from each other. For example, a pre-pulse period defined by the first type may be different from a pre-pulse period defined by the second type. The first type and the second type will be described in detail with reference to FIGS. 11, 12, and 13 together.

Under control of the control logic 121, the voltage generator 123 may control voltages to be applied to the memory cell array 125 through the row decoder 124. For example, under control of the control logic 121, the voltage generator 123 may generate voltages corresponding to the core operation of the first type or may generate voltages corresponding to the core operation of the second type.

The row decoder 124 may receive the row address ADDR from the control logic 121. The row decoder 124 may be connected with the memory cell array 125 through string selection lines SSL, word lines WL, and ground selection lines GSL. The row decoder 124 may decode the row address ADDR, and may control voltages to be applied to the string selection lines SSL, the word lines WL, and the ground selection lines GSL based on a decoding result and voltages received from the voltage generator 123.

The memory cell array 125 may include the plurality of memory blocks BLK. Each of the plurality of memory blocks BLK may be similar in structure to a memory block BLK illustrated in FIG. 4. The memory block BLK illustrated in FIG. 4 may correspond to a physical erase unit of the non-volatile memory device 120, but the physical erase unit may be a page unit, a word line unit, a sub-block unit, or the like.

Referring to FIG. 4, the memory block BLK may include a plurality of cell strings CS11, CS12, CS21, and CS22. The plurality of cell strings CS11, CS12, CS21, and CS22 may be arranged in a row direction and a column direction. For brevity of drawing, 4 cell strings CS11, CS12, CS21, and CS22 are illustrated in FIG. 4, but the number of cell strings may be greater or less in the row direction or the column direction.

Cell strings placed at the same column from among the plurality of cell strings CS11, CS12, CS21, and CS22 may be connected with the same bit line. For example, the cell strings CS11 and CS21 may be connected with a first bit line BL1, and the cell strings CS12 and CS22 may be connected with a second bit line BL2. Each of the plurality of cell strings CS11, CS12, CS21, and CS22 may include a plurality of cell transistors. Each of the plurality of cell transistors may be implemented with a charge trap flash (CTF) memory cell. The plurality of cell transistors may be stacked in a height direction that is a direction perpendicular to a plane (e.g., a semiconductor substrate (not illustrated)) defined by the row direction and the column direction.

The plurality of cell transistors may be connected in series between a corresponding bit line (e.g., BL1 or BL2) and a common source line CSL. For example, the plurality of cell transistors may include string selection transistors SSTa and SSTb, dummy memory cells DMC1 and DMC2, memory cells MC1 to MC4, and ground selection transistors GSTa and GSTb. The serially-connected string selection transistors SSTa and SSTb may be provided between the serially-connected memory cells MC1 to MC4 and the corresponding bit line (e.g., BL1 and BL2). The serially-connected ground selection transistors GSTa and GSTb may be provided between the serially-connected memory cells MC1 to MC4 and the common source line CSL.

In some example embodiments, the second dummy memory cell DMC2 may be provided between the serially-connected string selection transistors SSTa and SSTb and the serially-connected memory cells MC1 to MC4, and the first dummy memory cell DMC1 may be provided between the serially-connected memory cells MC1 to MC4 and the serially-connected ground selection transistors GSTa and GSTb.

Memory cells placed at the same height from among the memory cells MC1 to MC4 of the plurality of cell strings CS11, CS12, CS21, and CS22 may share the same word line. For example, the first memory cells MC1 of the plurality of cell strings CS11, CS12, CS21, and CS22 may be placed at the same height from the semiconductor substrate (not illustrated) and may share a first word line WL1. The second memory cells MC2 of the plurality of cell strings CS11, CS12, CS21, and CS22 may be placed at the same height from the semiconductor substrate (not illustrated) and may share a second word line WL2. Likewise, the third memory cells MC3 of the plurality of cell strings CS11, CS12, CS21, and CS22 may be placed at the same height from the semiconductor substrate (not illustrated) and may share a third word line WL3, and the fourth memory cells MC4 of the plurality of cell strings CS11, CS12, CS21, and CS22 may be placed at the same height from the semiconductor substrate (not illustrated) and may share a fourth word line WL4.

Dummy memory cells placed at the same height from among the dummy memory cells DMC1 and DMC2 of the plurality of cell strings CS11, CS12, CS21, and CS22 may share the same dummy word line. For example, the first dummy memory cells DMC1 of the plurality of cell strings CS11, CS12, CS21, and CS22 may share a first dummy word line DWL1, and the second dummy memory cells DMC2 of the plurality of cell strings CS11, CS12, CS21, and CS22 may share a second dummy word line DWL2.

String selection transistors placed at the same height and the same row from among the string selection transistors SSTa and SSTb of the plurality of cell strings CS11, CS12, CS21, and CS22 may share the same string selection line. For example, the string selection transistors SSTb of the cell strings CS11 and CS12 may share a string selection line SSL1b, and the string selection transistors SSTa of the cell strings CS11 and CS12 may share a string selection line SSL1a. The string selection transistors SSTb of the cell strings CS21 and CS22 may be connected with a string selection line SSL2b, and the string selection transistors SSTa of the cell strings CS21 and CS22 may be connected with a string selection line SSL2a.

Ground selection transistors placed at the same height and the same row from among the ground selection transistors GSTa and GSTb of the plurality of cell strings CS11, CS12, CS21, and CS22 may be connected with the same ground selection line. For example, the ground selection transistors GSTb of the cell strings CS11 and CS12 may be connected with a ground selection line GSL1b, and the ground selection transistors GSTa of the cell strings CS11 and CS12 may be connected with a ground selection line GSL1a. The ground selection transistors GSTb of the cell strings CS21 and CS22 may be connected with a ground selection line GSL2b, and the ground selection transistors GSTa of the cell strings CS21 and CS22 may be connected with a ground selection line GSL2a.

The memory block BLK illustrated in FIG. 4 is merely an example and, for example, the number of cell strings may be greater or fewer, and the number of rows of cell strings and the number of columns of cell strings may be greater or fewer depending on the number of cell strings. Also, in the memory block BLK, the number of cell transistors may be greater or fewer, the height of the memory block BLK may be greater or less depending on the number of cell transistors, and the number of lines connected with the cell transistors may be greater or fewer depending on the number of cell transistors.

In some example embodiments, the memory block BLK may include a plurality of memory pages. For example, the first memory cells MC1 of the cell strings CS11, CS12, CS21, and CS22 connected with the first word line WL1 may be referred to as a "first physical page". For example, the second memory cells MC2 of the cell strings CS11, CS12, CS21, and CS22 connected with the second word line WL2 may be referred to as a "second physical page".

Referring again to FIGS. 1 and 3, the page buffer unit 126 may include a plurality of page buffers PB. The page buffer unit 126 may be connected with the memory cell array 125 through the bit lines BL. The page buffer unit 126 may read data from the memory cell array 125 in units of page, by sensing voltages of the bit lines BL.

The column decoder 127 may receive the column address ADDC from the control logic 121. The column decoder 127 may decode the column address ADDC, and may provide the data read by the page buffer unit 126 to the I/O circuit 128 based on a decoding result.

The column decoder 127 may receive data from the I/O circuit 128 through data lines DL. The column decoder 127 may receive the column address ADDC from the control logic 121. The column decoder 127 may decode the column address ADDC, and may provide the data received from the I/O circuit 128 to the page buffer unit 126 based on a decoding result. The page buffer unit 126 may store the data provided from the I/O circuit 128 in the memory cell array 125 through the bit lines BL in units of page.

The I/O circuit 128 may be connected with the column decoder 127 through the data lines DL. The I/O circuit 128 may provide data received from the storage controller 110 to the column decoder 127 through the data lines DL. The I/O circuit 128 may output data received through the data lines DL to the storage controller 110.

Figure 5:
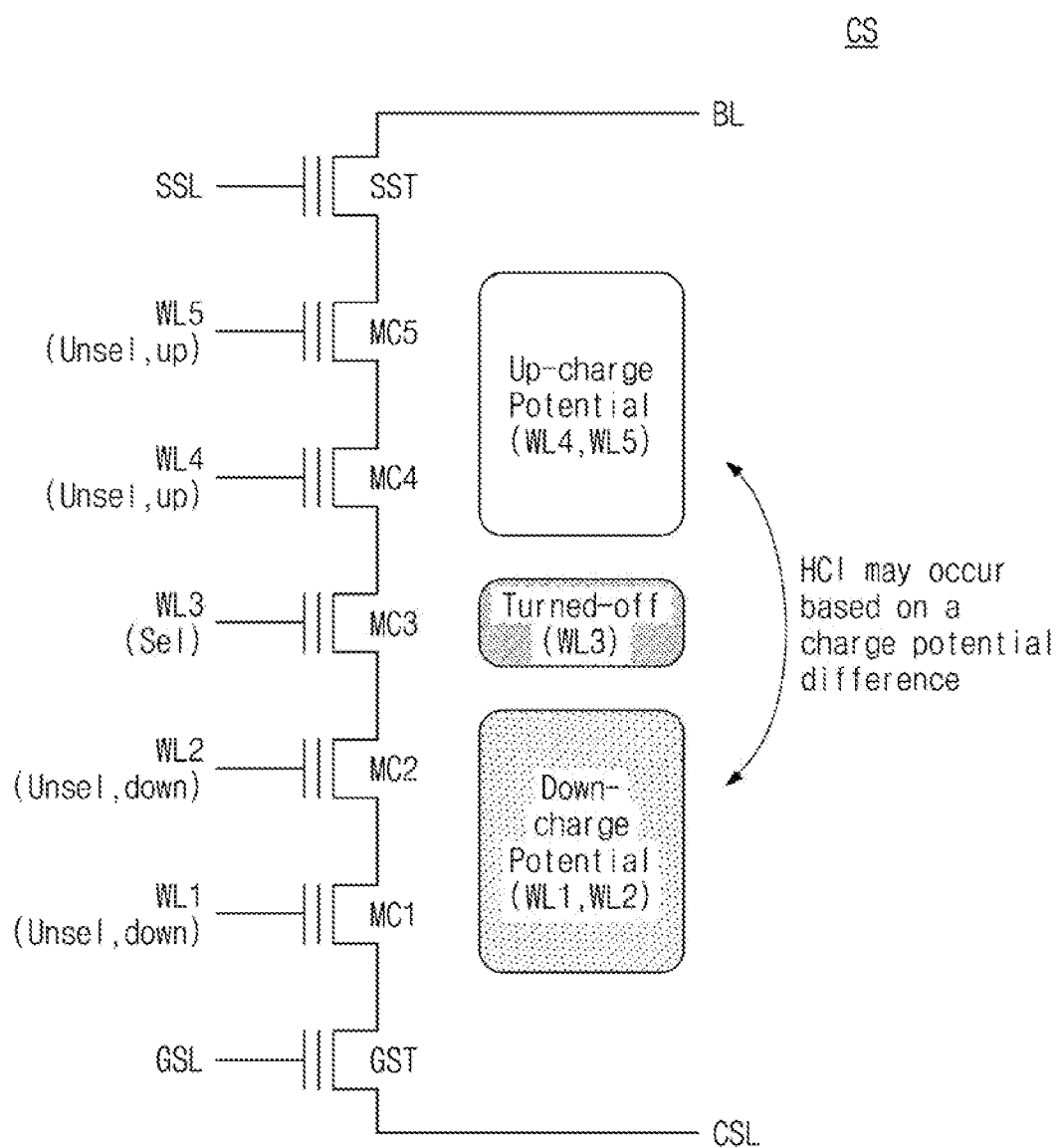
FIG. 5 is a diagram describing a cell string of a memory block according to some example embodiments.

FIG. 5 is a diagram describing a cell string of a memory block according to some example embodiments.

A cell string CS of a memory block is illustrated in FIG. 5. The cell string CS may correspond to one of the cell strings CS11, CS12, CS21, and CS22 of the memory block BLK of FIG. 4.

The cell string CS may be connected with, e.g., between, a bit line BL and the common source line CSL. The cell string CS may include a ground selection transistor GST, first to fifth memory cells MC1 to MC5, and a string selection transistor SST connected in series. The ground selection transistor GST may operate in response to a voltage level of the ground selection lines GSL. The first to fifth memory cells MC1 to MC5 may operate in response to voltage levels of first to fifth word lines WL1 to WL5. The string selection transistor SST may operate in response to a voltage level of the string selection lines SSL.

According to some example embodiments, a device characteristic may be degraded by a charge potential across a memory cell of the cell string CS, which is controlled by a selected word line. For example, a non-volatile memory device including the cell string CS may receive a request for the core operation corresponding to the selected word line. For example, the third word line WL3 may be the selected word line, and the first, second, fourth, and fifth word lines WL1, WL2, WL4, and WL5 may be unselected word lines. For convenience of description, a voltage level of the first and second word lines WL1 and WL2 is referred to as a "down-charge potential", and a voltage level of the fourth and fifth word lines WL4 and WL5 is referred to as an "up-charge potential".

The third memory cell MC3 of the cell string CS, which is controlled by the third word line WL3, may be turned on during the pre-pulse period of the core operation and may then be turned off. The pre-pulse period may be a period in which the cell string CS is initialized for the core operation. The pre-pulse period may be a period in which a high voltage is provided to the string selection lines SSL. When a length of the pre-pulse period is insufficient, there may occur a difference between the down-charge potential and the up-charge potential. Hot carrier injection (HCI) may occur based on the charge potential difference. The HCI may mean that carriers having high electrical energy pass through an insulating layer, which may cause the degradation of a device characteristic. A threshold voltage level of a memory cell may be changed by the HCI, thereby causing the reduction of reliability of the non-volatile memory device.

FIG. 6 is a diagram describing an initial core operation and a subsequent core operation according to some example embodiments.

Graphs of voltages applied to the cell string CS in a normal case and an abnormal case will be described with reference to FIGS. 5 and 6.

In the graphs, a horizontal axis represents a time, and a vertical axis represents a voltage level. A solid line may indicate a voltage level of an unselected word line (e.g., one of the first, second, fourth, and fifth word lines WL1, WL2, WL4, and WL5). A bold solid line may indicate a voltage level of the string selection line SSL. A dashed line may indicate a voltage level of the ground selection line GSL.

The normal case may correspond to the subsequent core operation of a touched block. Referring to the graph of the normal case, at a first point in time T1, voltage levels of the unselected word line, the string selection line SSL, and the ground selection line GSL may increase. At a second point in time T2, the voltage level of the unselected word line may continue to increase, and the voltage levels of the string selection line SSL and the ground selection line GSL may decrease. The time period from T1 to T2 may be referred to as a "pre-pulse period".

In detail, in the pre-pulse period, the voltage level of the unselected word line may increase from a power supply voltage Vdd to a voltage Vx. The power supply voltage Vdd may be a voltage for driving a non-volatile memory device. The voltage Vx may be a voltage smaller than a read voltage Vread. The read voltage Vread may be a voltage that is used in the read operation and turns on a memory cell regardless of a programmed threshold voltage level of the memory cell. In the pre-pulse period, the voltage levels of the string selection line SSL and the ground selection line GSL may be higher than a level of a threshold voltage Vth of the string selection transistor SST and the ground selection transistor GST. That is, the string selection transistor SST and the ground selection transistor GST may be turned on in the pre-pulse period.

At the second point in time T2, the voltage level of the unselected word line may increase from the voltage Vx to the read voltage Vread. A difference between the read voltage Vread and the voltage Vx may be referred to as a "first boost voltage Vbst1". In the case where the first boost voltage Vbst1 is not sufficiently great, the degradation phenomenon such as HCI may be suppressed. As the voltage levels of the string selection line SSL and the ground selection line GSL may continue to decrease, at the second point in time T2, the string selection line SSL and the ground selection line GSL may have a given voltage level.

The abnormal case may correspond to the initial core operation of an untouched block. Referring to the graph of the abnormal case, the unselected word line may have an initial voltage Vi before the first point in time T1. The initial voltage Vi may be smaller than the power supply voltage Vdd. For example, a voltage of a word line that is provided to the cell string CS that do not experience the core operation after the power-on or reset operation may be smaller than a designed voltage (e.g., the power supply voltage Vdd).

In detail, in the pre-pulse period, the voltage level of the unselected word line may increase from the initial voltage Vi to a voltage Vy. The voltage Vy may be a voltage smaller than the read voltage Vread. In this case, because the initial voltage Vi is smaller than the power supply voltage Vdd, the voltage Vy may be smaller than the voltage Vx in the normal case under the condition that the pre-pulse period is not changed. In the pre-pulse period, the voltage levels of the string selection line SSL and the ground selection line GSL may be higher than a level of the threshold voltage Vth of the string selection transistor SST and the ground selection transistor GST.

At the second point in time T2, the voltage level of the unselected word line may increase from the voltage Vy to the read voltage Vread. A difference between the read voltage Vread and the voltage Vy may be referred to as a "second boost voltage Vbst2". The second boost voltage Vbst2 that is sufficiently great may cause the degradation phenomenon such as HCI.

That is, under the condition that the pre-pulse period is not changed, compared to the normal case such as the subsequent core operation, the degradation phenomenon such as HCI may frequently occur in the abnormal case such as the initial core operation. As such, it may be desirable to separately manage the initial core operation of the untouched block and the subsequent core operation of the touched block.

Figure 7:
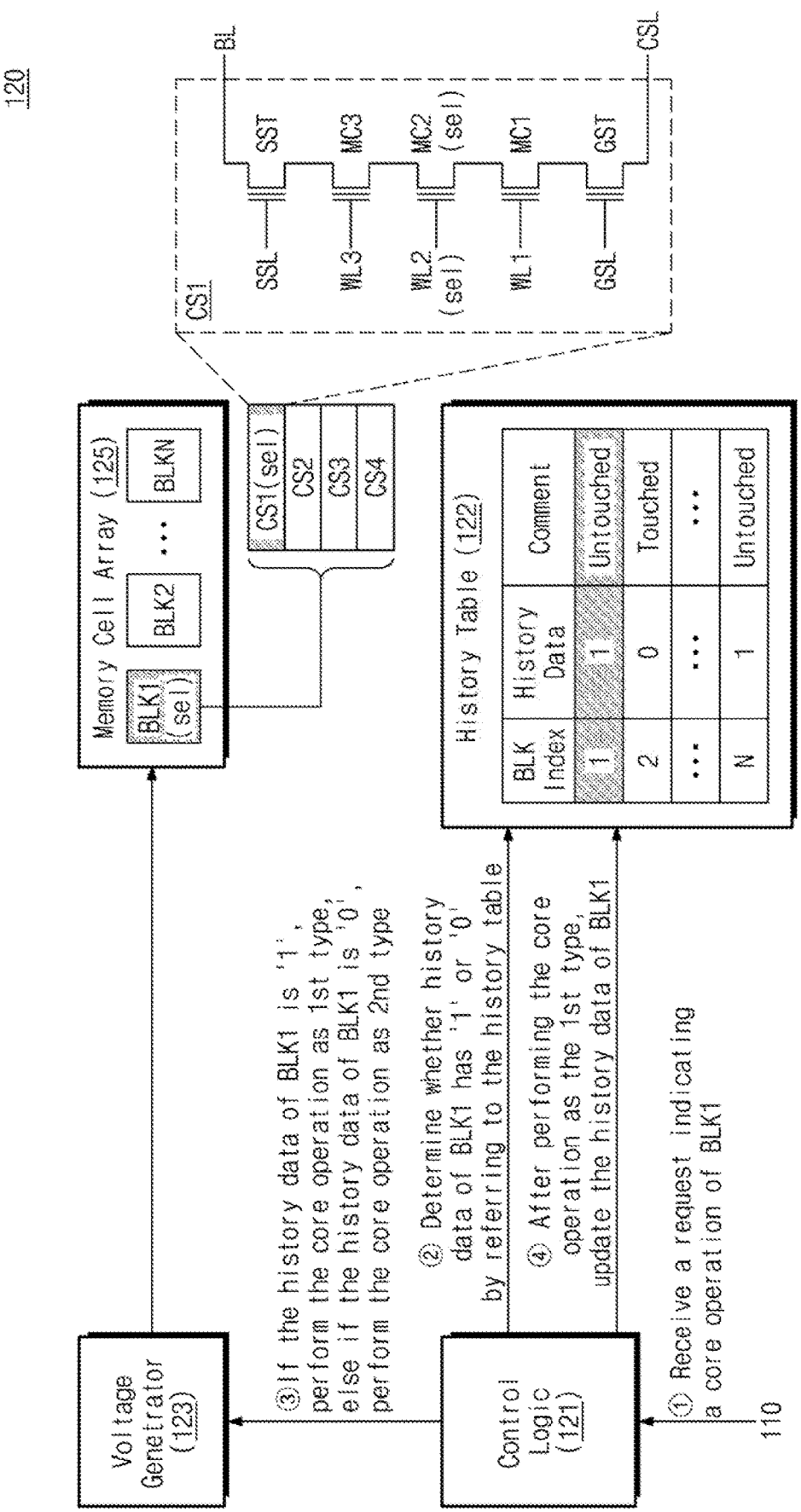
FIG. 7 is a diagram describing a method of operating a non-volatile memory device according to some example embodiments.

FIG. 7 is a diagram describing a method of operating a non-volatile memory device according to some example embodiments.

Referring to FIG. 7, the non-volatile memory device 120 may communicate with the storage controller 110. The non-volatile memory device 120 may include the control logic 121, the history table 122, the voltage generator 123, and the memory cell array 125. The non-volatile memory device 120 may correspond to the non-volatile memory device 120 of FIGS. 1 and 3.

The control logic 121 may control the voltage generator 123 with reference to the history table 122 under control of the storage controller 110. The history table 122 may manage a plurality of history data. The history table 122 may manage history data corresponding to each of a plurality of memory blocks BLK1 to BLKN of the memory cell array 125. When the history data have a first value (e.g., "1"), the corresponding memory block may be an untouched memory block. When the history data have a second value (e.g., "0"), the corresponding memory block may be a touched memory block. For example, the history data of the first memory block BLK1 and the N-th memory block BLKN may have the first value, and the history data of the second memory block BLK2 may have the second value.

In another implementation, the number of history data managed by the history table 122 may be less than the number of memory blocks of the memory cell array 125. This will be described in detail with reference to FIGS. 9 and 10.

Under control of the control logic 121, the voltage generator 123 may provide the memory cell array 125 with voltages (e.g., voltages of the first to third word lines WL1 to WL3, the string selection line SSL, and the ground selection line GSL) corresponding to the core operation.

The memory cell array 125 may include the plurality of memory blocks BLK1 to BLKN. One of the plurality of memory blocks BLK1 to BLKN may correspond to the core operation. For example, the first memory block BLK1 may be a target memory block corresponding to the core operation. The first memory block BLK1 may include first to fourth cell strings CS1 to CS4. The first cell string CS1 may be a cell string selected in the core operation. The second to fourth cell strings CS2 to CS4 may be cell strings not selected in the core operation. The first cell string CS1 may include the ground selection transistor GST, the first to third memory cells MC1 to MC3, and the string selection transistor SST. The second word line WL2 may be a selected word line. The first and third word lines WL1 and WL3 may be unselected word lines. The ground selection transistor GST, the first to third memory cells MC1 to MC3, and the string selection transistor SST may operate based on voltages of the ground selection line GSL, the first to third word lines WL1 to WL3, and the string selection line SSL.

To prevent FIG. 7 from being overly complicated, the first memory block BLK1 is illustrated as including the first to fourth cell strings CS1 to CS4 and the first cell string CS1 includes the first to third memory cells MC1 to MC3, but the number of cell strings included in each of the plurality of memory blocks BLK1 to BLKN may be greater or less. Also, unlike the example illustrated in FIG. 7, the number of memory cells included in a cell string may be greater or less.

Below, a method of operating the non-volatile memory device 120 according to some example embodiments will be described.

In operation ①, the control logic 121 may receive a request indicating the core operation of the first memory block BLK1 from the storage controller 110. For example, the core operation may refer to an operation that is performed in a non-volatile memory device, such as a read operation, a program operation, or an erase operation. In some example embodiments, the request may include a command indicating the core operation and an address indicating a location at which the core operation is to be performed.

In operation ②, the control logic 121 may determine whether history data of a target memory block has the first value or the second value, with reference to the history table 122. For example, the target memory block on which the core operation is to be performed may be the first memory block BLK1. With reference to the history table 122, the control logic 121 may check that the history data of the first memory block BLK1 have the first value (e.g., "1"). That is, the control logic 121 may check that the first memory block BLK1 is an untouched memory block.

In operation ③, the control logic 121 may determine a type of the core operation to be performed on the target memory block, based on the history data.

For example, when the history data of the first memory block BLK1 have the first value, the control logic 121 may perform the core operation of the first type. The core operation of the first type may be performed on an untouched memory block. As another example, when the history data of the first memory block BLK1 have the second value, the control logic 121 may perform the core operation of the second type. The core operation of the second type may be performed on a touched memory block.

In some example embodiments, the type of the core operation may define the pre-pulse period. For example, the first type may define a first pre-pulse period, and the second type may define a second pre-pulse period. A length of the first pre-pulse period may be longer than a length of the second pre-pulse period. A voltage that is provided to an unselected word line in the first pre-pulse period may be greater than a voltage that is provided to an unselected word line in the second pre-pulse period. The type of the pre-pulse period will be described in detail with reference to FIGS. 11, 12, and 13.

After performing the first type of core operation on the target memory block, in operation ④, the control logic 121 may update the history data of the target memory block in the history table 122 from the first value to the second value. For example, the target memory block may be the first memory block BLK1. After performing the core operation of the first type on the first memory block BLK1 being an untouched block, the control logic 121 may update the history data of the first memory block BLK1 in the history table 122 from the first value to the second value. That the history data are updated to have the second value may mean that the corresponding memory block is a touched memory block.

As another example, unlike the example of FIG. 7, when the first memory block BLK1 is a touched block, the control logic 121 may perform the core operation of the second type and may not update the history table 122. That is, an operation of updating history data of a target memory block may be omitted with regard to a touched block.

FIG. 8 is a graph describing a charge potential difference according to some example embodiments.

A charge potential difference according to a length of a pre-pulse period will be described with reference to FIG. 8. In FIG. 8, a horizontal axis represents a time, and a vertical axis represents a voltage level.

A solid line may indicate a waveform of a charge potential difference in an untouched memory block to which a normal pre-pulse period is applied. A bold solid line may indicate a waveform of a charge potential difference in an untouched memory block to which a long pre-pulse period is applied. A dashed line may indicate a waveform of a charge potential difference in a touched memory block to which a normal pre-pulse period (e.g., a short pre-pulse period) is applied.

The normal pre-pulse period may be a time period from a first point in time T1 to a second point in time T2. The normal pre-pulse period may be a pre-pulse period that is normally used for the core operation in a non-volatile memory device.

The short pre-pulse period may be a time period from the first point in time T1 to a 2a-th point in time T2a (or a point in time closer to the first point in time T1 than the second point in time T2). The short pre-pulse period may be shorter than the normal pre-pulse period.

The long pre-pulse period may be a time period from the first point in time T1 to a 2b-th point in time T2b (or a point in time more distant from the first point in time T1 than the second point in time T2). The long pre-pulse period may be longer than the normal pre-pulse period.

In some example embodiments, even though the length of the pre-pulse period is uniform, the charge potential difference may change depending on whether a corresponding memory block is touched. For example, referring to the waveform of the solid line, a magnitude of the charge potential difference may be great after the normal pre-pulse period is applied. Referring to the waveform of the dashed line, a magnitude of the charge potential difference may be small after the normal pre-pulse period is applied.

In some example embodiments, the pre-pulse period longer than the normal pre-pulse period may be applied to an untouched memory block. For example, referring to the waveform of the solid line, a magnitude of the charge potential difference may be great after the normal pre-pulse period ends. In the case where the normal pre-pulse period is applied to an untouched memory block, the HCI may occur. That is, to suppress the occurrence of the HCI and to secure the reliability of the non-volatile memory device, the pre-pulse period longer than the normal pre-pulse period may be applied to an untouched memory block.

In some example embodiments, the pre-pulse period shorter than the normal pre-pulse period may be applied to a touched memory block. For example, referring to the waveform of the dashed line, a magnitude of the charge potential difference may be small after the normal pre-pulse period is applied. In the case where the normal pre-pulse period is applied to a touched memory block, the HCI may not occur. Even though the pre-pulse period shorter than the normal pre-pulse period is applied to a touched memory block, the HCI may not occur. That is, to improve a data processing speed while maintaining the reliability of the non-volatile memory device, the pre-pulse period shorter than the normal pre-pulse period may be applied to a touched memory block.

As described above, according to an example embodiment, by applying the long pre-pulse period to the initial core operation of an untouched memory block and applying the short pre-pulse period to the subsequent core operation of a touched memory block, the reliability and the data processing speed of the non-volatile memory device may be improved.

FIG. 9 is a diagram illustrating a history table of FIG. 7 in detail, according to some example embodiments.

The history table 122 according to some example embodiments will be described with reference to FIGS. 7 and 9.

The history table 122 may include a table index, a block index, and history data.

The table index may indicate a reference numeral for managing history data in the history table 122.

The block index may indicate a reference numeral of a memory block corresponding to a management target from among the plurality of memory blocks BLK1 to BLKN of the memory cell array 125.

The history data may indicate whether a corresponding memory block is a touched memory block or an untouched memory block.

In some example embodiments, the number of history data that the history table 122 manages may be less than the number of memory blocks of the memory cell array 125. The memory cell array 125 may include "N" memory blocks. The history table 122 may manage "M" history data. "N" may be an arbitrary natural number. "M" may be a natural number less than "N".

In detail, when history data of a target memory block are absent from the history table 122, the control logic 121 may determine that the history data of the target memory block have the first value (e.g., "1"). The control logic 121 may perform the core operation of the first type on the target memory block. The core operation of the first type may define the long pre-pulse period or the pre-pulse period having a higher voltage level. After the core operation of the first type is performed, the control logic 121 may store an index of the target memory block in the history table 122 and may update history data corresponding to the target memory block from the first value (e.g., "1") to the second value (e.g., "0").

As in the above description, when the history data of the target memory block are present in the history table 122, the control logic 121 may determine that the history data of the target memory block have the second value (e.g., "0"). The control logic 121 may perform the core operation of the second type on the target memory block. The core operation of the second type may define the short pre-pulse period or the pre-pulse period having a low voltage level.

In some example embodiments, the history table 122 may be initialized in the initial operation. For example, when the initial operation such as a power-on operation or a reset operation is performed in the non-volatile memory device, all the block indexes may be set to be empty, and all the history data may be set to the first value.

In some example embodiments, the control logic 121 may check a free space of the history table 122. For example, after performing the core operation of the first type, the control logic 121 may determine whether a free space is present in the history table 122. When it is determined that the free space is present in the history table 122 (e.g., that a table index corresponding to an empty block index is present in the history table 122), the control logic 121 may store an index of a target memory block in the free space and may change a value of history data from the first value to the second value.

As another example, after performing the core operation of the first type, the control logic 121 may determine whether a free space is present in the history table 122. When it is determined that the free space is absent from the history table 122, the control logic 121 may secure an additional free space by making history data of a low priority empty. The control logic 121 may store an index of a target memory block in the additional free space and may change a value of history data from the first value to the second value. This will be described in detail with reference to FIG. 10.

FIG. 10 is a diagram illustrating a history table of FIG. 7 in detail, according to some example embodiments.

The history table 122 according to some example embodiments will be described with reference to FIGS. 7, 9, and 10. Unlike the history table 122 of FIG. 9, all the history data in the history table 122 of FIG. 10 may be used. That is, the history table 122 may not have a free space.

According to some example embodiments, the history table 122 may manage information about priorities. For example, the history table 122 may manage at least one of an update order and a reference count for each history data. The update order may indicate an order at which history data are updated in the history table 122. As a value of the update order becomes smaller, history data corresponding to the update order may become older. The reference count may be the number of times that the core operation is performed in a corresponding memory block. When the history table 122 is initialized, both the update order and the reference count may be emptied.

In some example embodiments, the history table 122 may determine a priority based on at least one of the update order and the reference count. For example, as a value of the update order becomes smaller, a priority may become lower, alternatively, as a value of the reference count becomes smaller, a priority may become lower. Alternatively, a priority may be determined based on a combination of the update order and the reference count.

In some example embodiments, when a free space is absent from the history table 122, the control logic 121 may make history data of the lowest priority empty. For example, after the core operation of the first type is performed, when it is determined that a free space is absent from the history table 122, the control logic 121 may secure an additional free space by making history data of a low priority empty. The additional free space may be used to manage history data of a target memory block and priority information.

Figure 11:
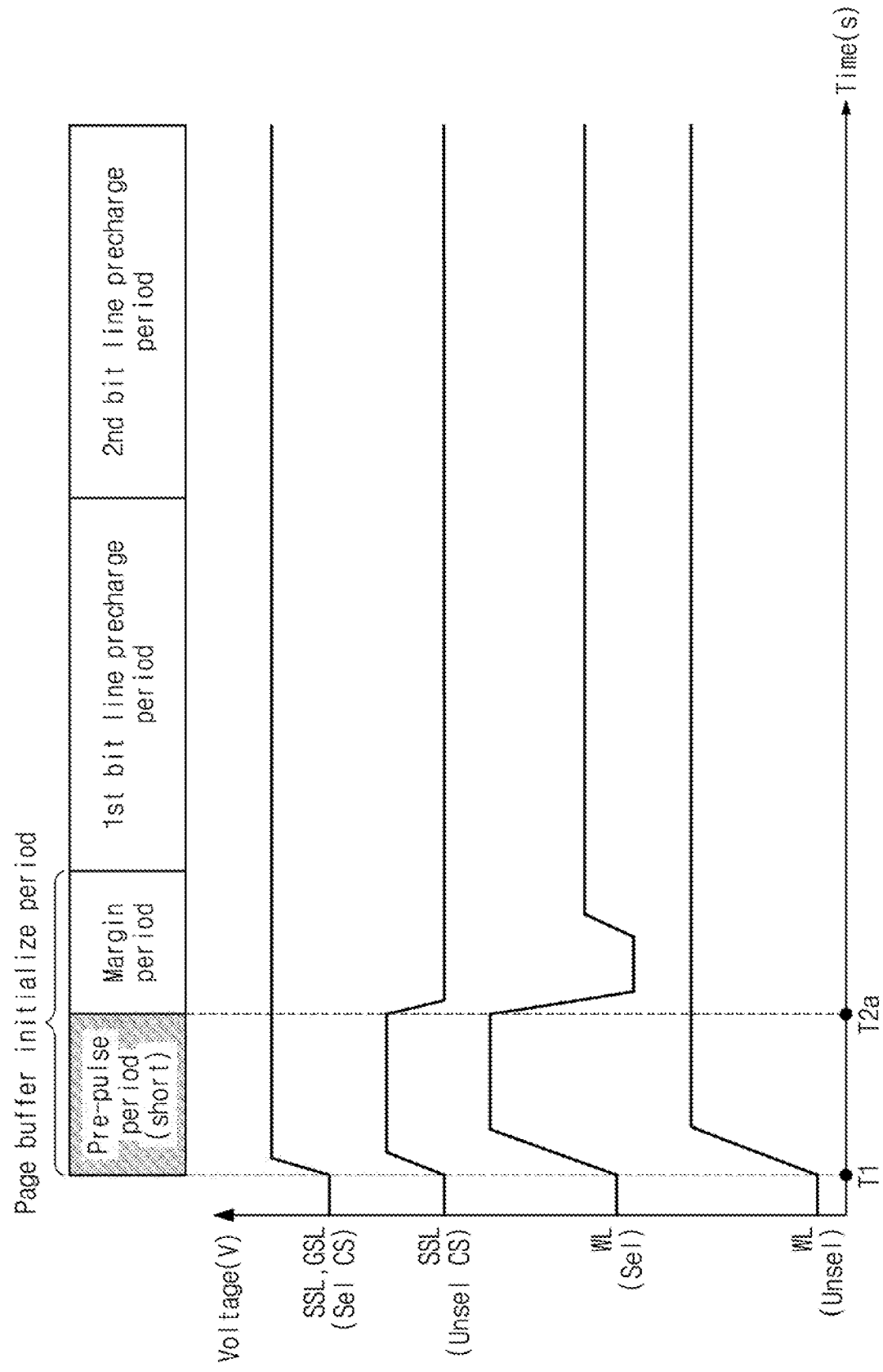
FIG. 11 is a diagram describing a pre-pulse period according to some example embodiments.

FIG. 11 is a diagram describing a pre-pulse period according to some example embodiments.

The short pre-pulse period that is used in the core operation of the second type will be described with reference to FIGS. 7 and 11. In FIG. 11, a horizontal axis represents a time, and a vertical axis represents a voltage level.

The core operation may include a page buffer initialization period, a first bit line precharge period, and a second bit line precharge period. The page buffer initialization period may be a period in which voltages provided to a page buffer of a non-volatile memory device are initialized prior to data processing. The first and second bit line precharge periods may be periods in which a precharge voltage is provided to bit lines prior to the core operation.

The page buffer initialization period may include the short pre-pulse period and a margin period. The short pre-pulse period may be a time period from the first point in time T1 to the 2a-th point in time T2a (or a short point in time T2a). The margin period may be a period in which a voltage of a word line is stabilized prior to a bit line voltage precharge operation.

Referring to a waveform of a selected cell string, voltage levels of the string selection line SSL and the ground selection line GSL may increase at the first point in time T1 and may then be maintained at a high voltage level. That is, the string selection transistor SST and the ground selection transistor GST may be maintained at a turn-on state.

Referring to a waveform of an unselected cell string, the string selection line SSL may have a high voltage level in the pre-pulse period. That is, the string selection transistor SST may be temporarily turned on in the pre-pulse period.

Referring to a waveform of a selected word line, the selected word line may have a high voltage level in the pre-pulse period. Afterwards, the selected word line may have a voltage level corresponding to the core operation.

Referring to a waveform of an unselected word line, the unselected word line may have a high voltage level in the pre-pulse period. Afterwards, the unselected word line may maintain the high voltage level.

Figure 12:
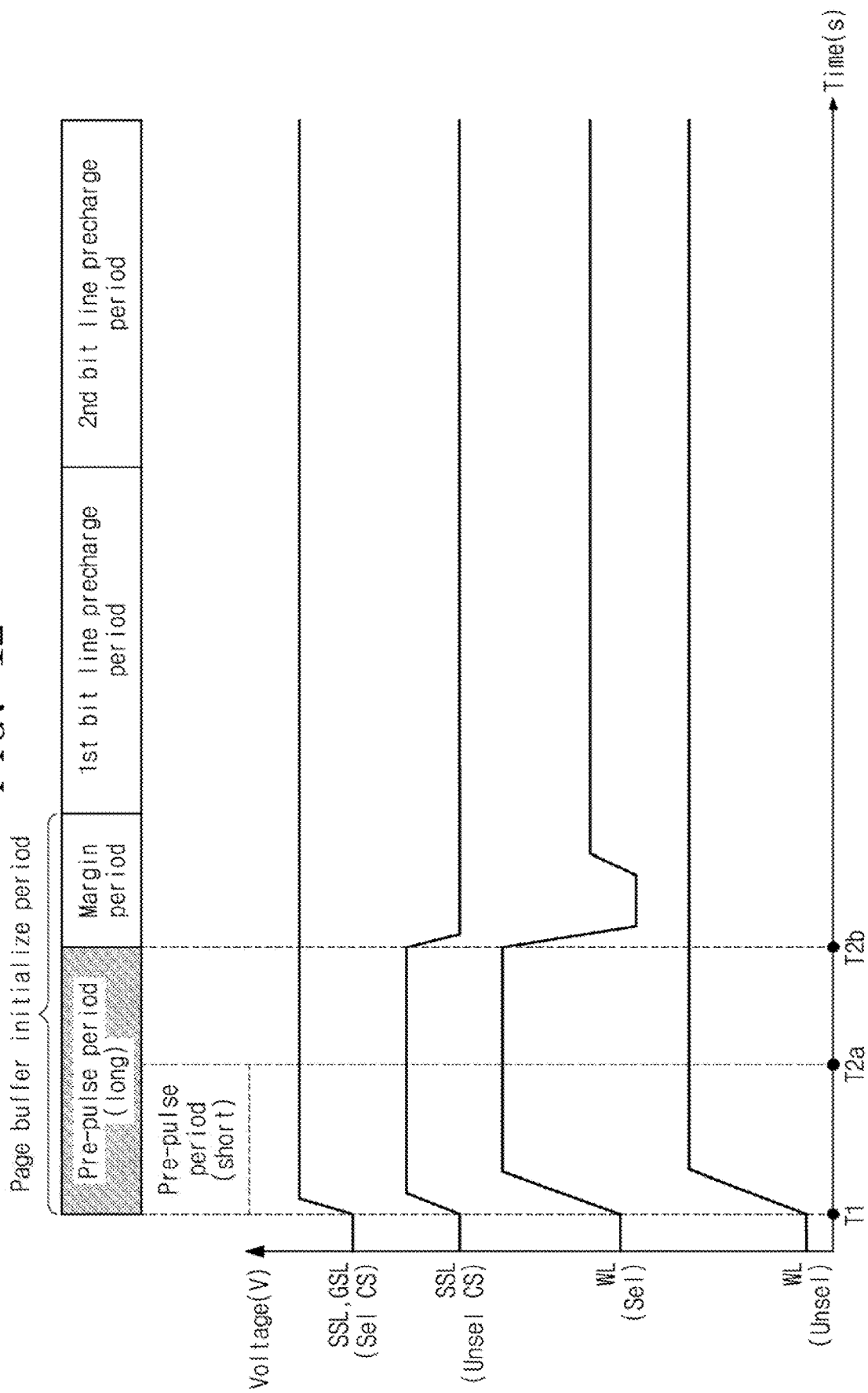
FIG. 12 is a diagram describing a pre-pulse period according to some example embodiments.

FIG. 12 is a diagram describing a pre-pulse period according to some example embodiments.

The long pre-pulse period that is used in the core operation of the first type will be described with reference to FIGS. 7 and 12. In FIG. 12, a horizontal axis represents a time, and a vertical axis represents a voltage level.

A page buffer initialization period, a first bit line precharge period, and a second bit line precharge period are similar to the page buffer initialization period, the first bit line precharge period, and the second bit line precharge period of FIG. 11, and thus, additional description will be omitted to avoid redundancy.

The page buffer initialization period may include the long pre-pulse period and the margin period. The long pre-pulse period may be a time period from the first point in time T1 to a 2b-th point in time T2b (or a long point in time T2b). The long pre-pulse period may be longer than the short pre-pulse period of FIG. 11.

In the case of applying the long pre-pulse period, a period in which the string selection line SSL of an unselected cell string has a high voltage level and a period in which a selected word line has a high voltage level may increase. For example, further referring to FIG. 5, as a length of the pre-pulse period increases, a time during which the string selection transistor SST and a memory cell corresponding to a selected word line are turned on may increase. As such, the charge potential difference may decrease. This may mean that the HCI is suppressed.

Figure 13:
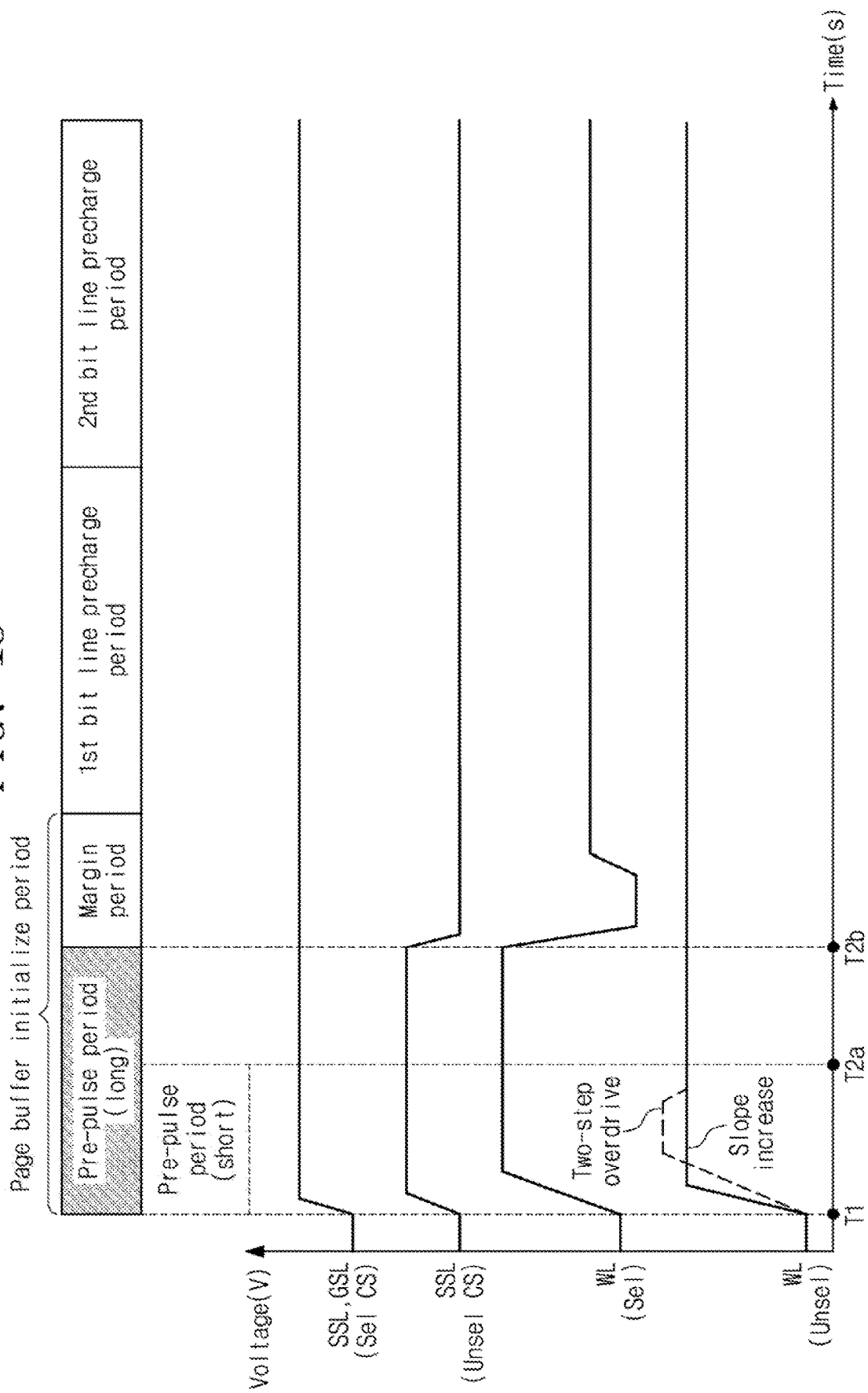
FIG. 13 is a diagram describing a pre-pulse period according to some example embodiments.

FIG. 13 is a diagram describing a pre-pulse period according to some example embodiments.

The long pre-pulse period that is used in the core operation of the first type will be described with reference to FIGS. 7 and 13. In FIG. 13, a horizontal axis represents a time, and a vertical axis represents a voltage level.

A page buffer initialization period, a first bit line precharge period, and a second bit line precharge period are similar to the page buffer initialization period, the first bit line precharge period, and the second bit line precharge period of FIG. 11, and thus, additional description will be omitted to avoid redundancy.

The page buffer initialization period may include the long pre-pulse period and the margin period. The long pre-pulse period may be a time period from the first point in time T1 to a 2b-th point in time T2b (or a long point in time T2b). The long pre-pulse period may be longer than the short pre-pulse period of FIG. 11.

According to some example embodiments, a voltage level of an unselected word line may be increased in the long pre-pulse period. For example, as the long pre-pulse period is applied to an untouched memory block, the voltage level of the unselected word line may be set to be high for the purpose of preventing the core operation from being delayed. In detail, in the case where the core operation is the read operation, it may be possible to shorten a read time by increasing the voltage level of the unselected word line.

In some example embodiments, a waveform of the voltage level of the unselected word line may have a sharp slope in the long pre-pulse period. For example, in the long pre-pulse period, a voltage level of an unselected word line in a target memory block may increase with a first slope. In the short pre-pulse period, the voltage level of the unselected word line in the target memory block may increase with a second slope. The first slope may be greater than the second slope (refer to FIGS. 11 and 13).

In some example embodiments, the voltage level of the unselected word line may be overdriven in a two-step scheme during long pre-pulse period. For example, in the long pre-pulse period, the voltage level of the unselected word line in the target memory block may increase from a first voltage level to a second voltage level and may then decrease from the second level to a third voltage level. In the short pre-pulse period, the voltage level of the unselected word line in the target memory block may increase from the first voltage level to the third voltage level. In this case, the third voltage level may be higher than the first voltage level and may be lower than the second voltage level. In detail, in the case where the core operation is the read operation, the first voltage level may be a voltage level of an unselected word line before the core operation is performed, and the third voltage level may correspond to a read voltage (refer to FIGS. 6, 11, and 13).

Figure 14:
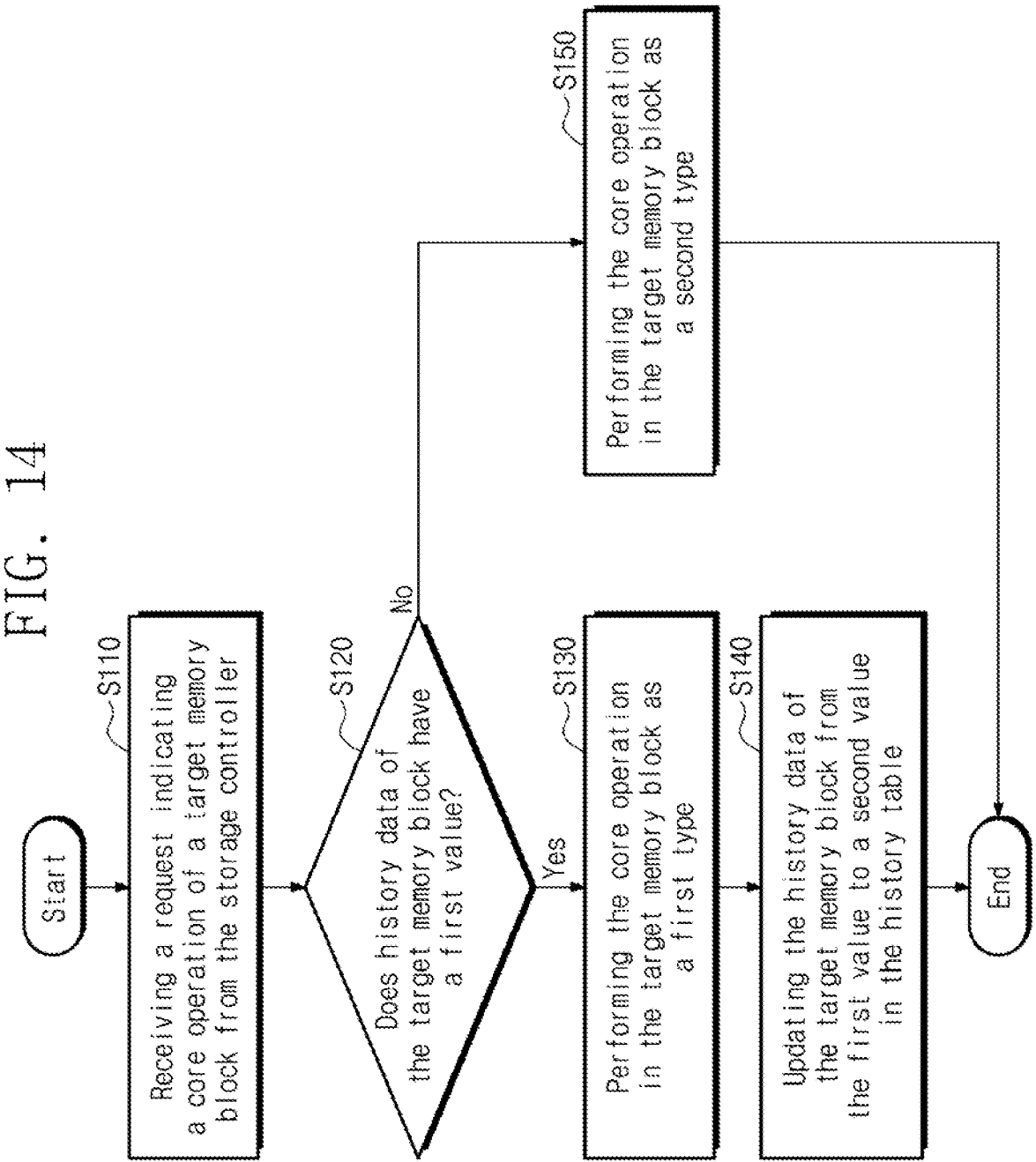
FIG. 14 is a flowchart describing a method of operating a non-volatile memory device according to some example embodiments.

FIG. 14 is a flowchart describing a method of operating a non-volatile memory device according to some example embodiments.

A method of operating a non-volatile memory device according to some example embodiments will be described with reference to FIG. 14. The non-volatile memory device may correspond to the non-volatile memory device 120 of FIGS. 1, 3, and 7. The non-volatile memory device may include a history table. The non-volatile memory device may communicate with a storage controller.

In operation S110, the non-volatile memory device may receive a request indicating a core operation of a target memory block from the storage controller. The target memory block may be a memory block in which the core operation is to be performed. The core operation may refer to an operation, which is performed in the non-volatile memory device, such as a read operation, a program operation, or an erase operation.

In operation S120, the non-volatile memory device may determine whether history data of the target memory block has the first value or the second value, with reference to the history table in response to the request in operation S110. The history data may indicate whether a corresponding memory block is a memory block touched after the power-on or reset operation. When the history data of the target memory block have the first value, the non-volatile memory device may perform operation S130.

In operation S130, the non-volatile memory device may perform the core operation of the first type on the target memory block. The core operation of the first type may define a first pre-pulse period. The first pre-pulse period may be the long pre-pulse period or may be the pre-pulse period having a higher voltage level.

In operation S140, the non-volatile memory device may update the history data of the target memory block in the history table from the first value to the second value.

Returning to operation S120, when the history data of the target memory block do not have the first value (i.e., have the second value), the non-volatile memory device may perform operation S150.

In operation S150, the non-volatile memory device may perform the core operation of the second type on the target memory block. The core operation of the second type may define a second pre-pulse period. The second pre-pulse period may be the short pre-pulse period or may be the pre-pulse period having a low voltage level.

Figure 15:
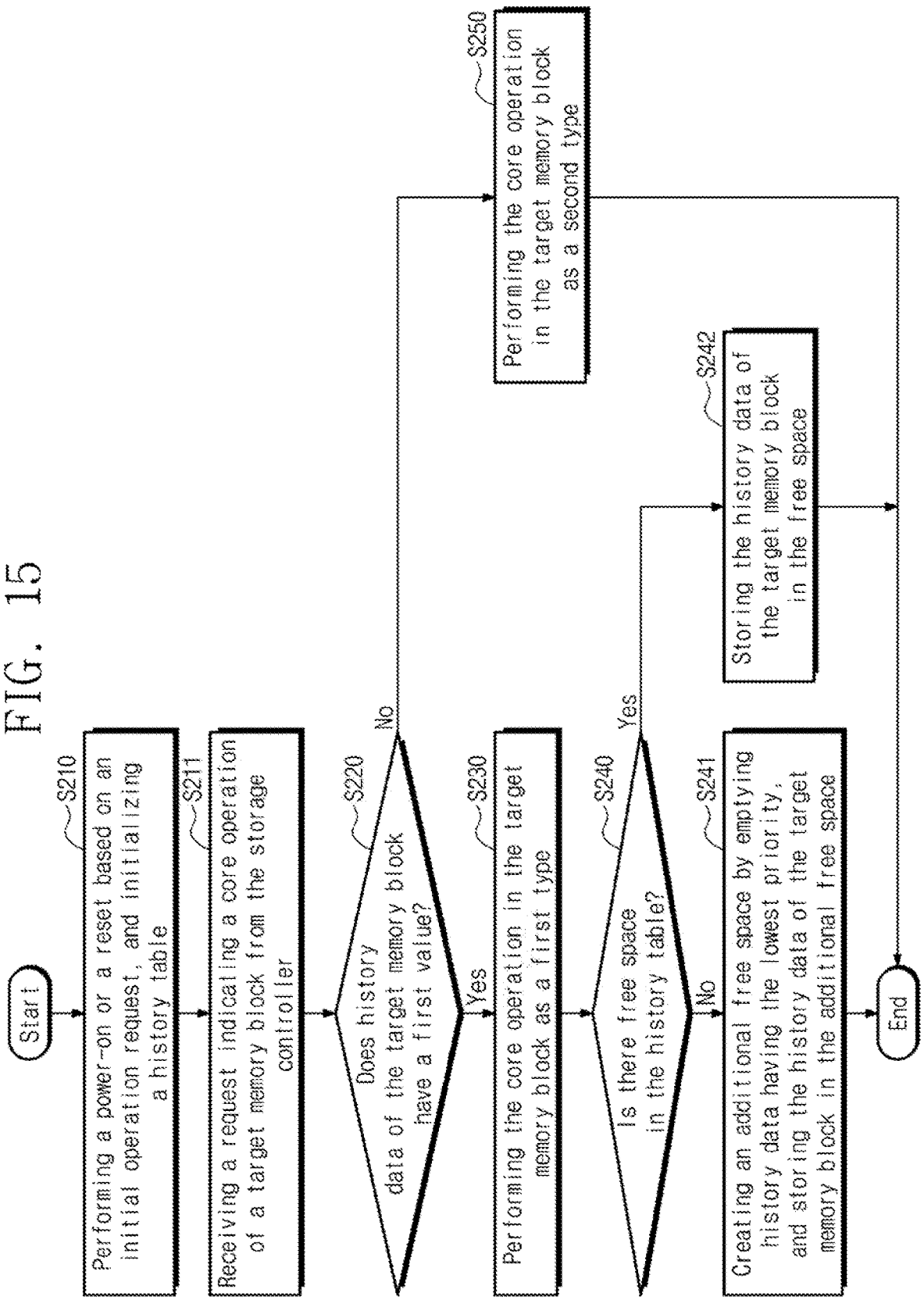
FIG. 15 is a flowchart describing a method of operating a non-volatile memory device according to some example embodiments.

FIG. 15 is a flowchart describing a method of operating a non-volatile memory device according to some example embodiments.

A method of operating a non-volatile memory device according to some example embodiments will be described with reference to FIG. 15. The non-volatile memory device may correspond to the non-volatile memory device 120 of FIGS. 1, 3, and 7. The non-volatile memory device may include a history table.

The non-volatile memory device may communicate with a storage controller. Operation S211, operation S220, operation S230, and operation S250 are similar to operation S110, operation S120, operation S130, and operation S150 of FIG. 14, and thus, additional description will be omitted to avoid redundancy.

In operation S210, the non-volatile memory device may receive an initial operation request from the storage controller. The non-volatile memory device may perform the power-on or reset operation based on the initial operation request. The non-volatile memory device may initialize the history table.

In operation S240, the non-volatile memory device may determine whether a free space is present in the history table. For example, the number of history data managed by the history table may be less than the number of memory blocks of the non-volatile memory device. When all the history data of the history table are used, a free space may be absent from the history table. When it is determined that the free space is absent from the history table, the non-volatile memory device may perform operation S241.

In operation S241, the non-volatile memory device may select history data having the lowest priority from among a plurality of history data in the history table. The non-volatile memory device may secure (or create) an additional free space by making the history data of the lowest priority empty. The non-volatile memory device may store the history data of the target memory block corresponding to operation S230 in the additional free space.

Returning to operation S240, when it is determined that the free space is present in the history table, the non-volatile memory device may perform operation S242.

In operation S242, the non-volatile memory device may store the history data of the target memory block corresponding to operation S230 in the free space.

Figure 16:
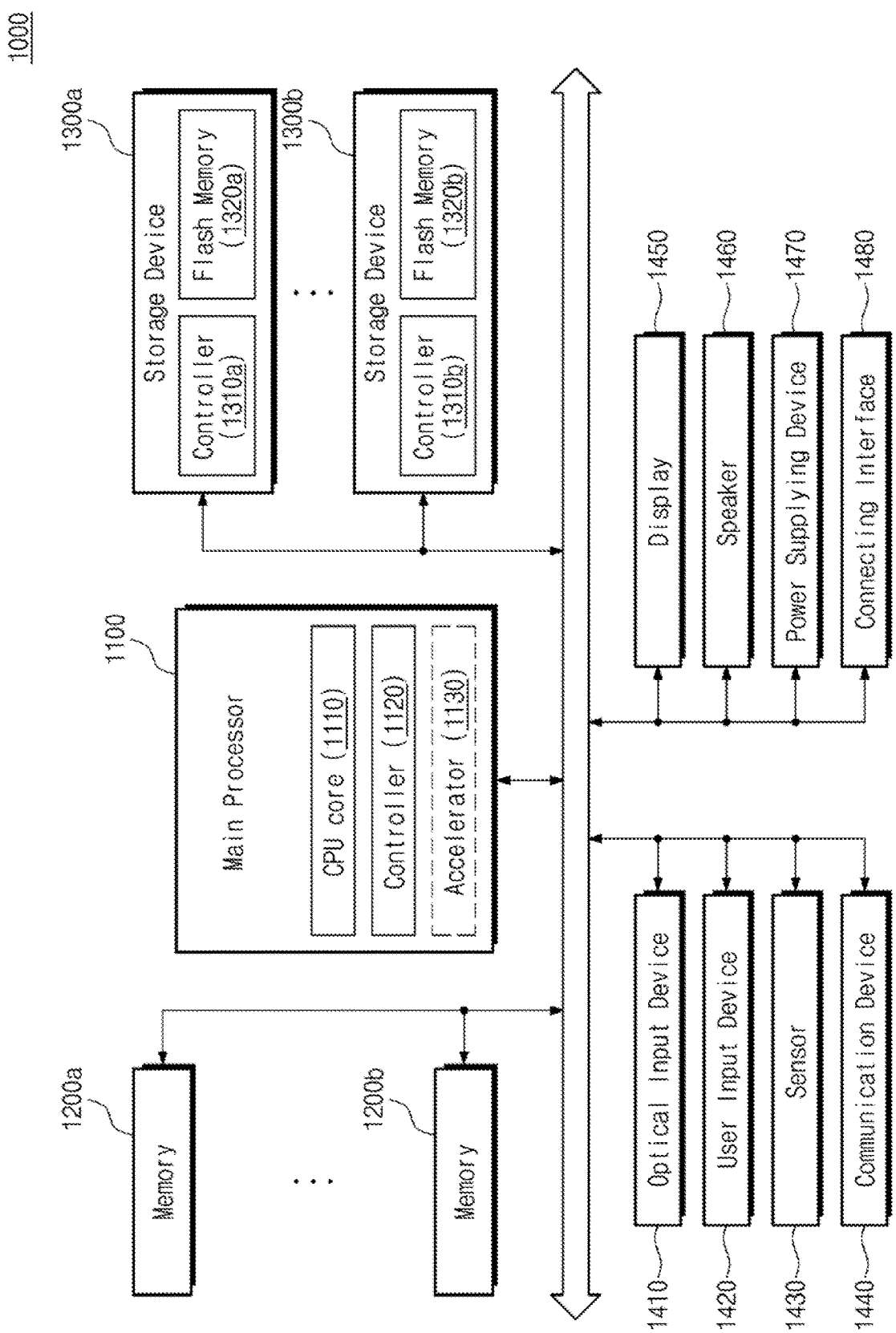
FIG. 16 is a diagram describing a storage system according to some example embodiments.

FIG. 16 is a diagram describing a storage system according to some example embodiments.

Referring to FIG. 16, the storage system 1000 may be a mobile system (such as a portable communication terminal (e.g., a mobile phone), a smartphone, a tablet personal computer (PC), a wearable device, a healthcare device, or an Internet of things (JOT) device), a PC, a laptop computer, a server, a media player, or an automotive device (e.g., a navigation device).

The storage system 1000 may include a main processor 1100, memories (e.g., 1200a and 1200b), and storage devices (e.g., 1300a and 1300b). In addition, the storage system 1000 may include at least one of an optical input device 1410, a user input device 1420, a sensor 1430, a communication device 1440, a display 1450, a speaker 1460, a power supplying device 1470, and a connecting interface 1480

Each of the storage devices 1300a and 1300b may correspond to the storage device 100 of FIG. 1. Each of the flash memories 1320a and 1320b of the storage devices 1300a and 1300b may correspond to the non-volatile memory device 120 of FIGS. 1, 2, and 7, and may perform operations of FIGS. 14 and 15.

The main processor 1100 may control all operations of the storage system 1000, more specifically, operations of other components included in the storage system 1000. The main processor 1100 may be implemented as a general-purpose processor, a dedicated processor, or an application processor.

The main processor 1100 may include at least one CPU core 1110 and further include a controller 1120 configured to control the memories 1200a and 1200b and/or the storage devices 1300a and 1300b. In some example embodiments, the main processor 1100 may further include an accelerator 1130, which is a dedicated circuit for a high-speed data operation, such as an artificial intelligence (AI) data operation. The accelerator 1130 may include a graphics processing unit (GPU), a neural processing unit (NPU), and/or a data processing unit (DPU), and may be implemented as a chip that is physically separate from the other components of the main processor 1100.

The memories 1200a and 1200b may be used as main memory devices of the storage system 1000. Although each of the memories 1200a and 1200b may include a volatile memory, such as static random access memory (SRAM) and/or dynamic RAM (DRAM), each of the memories 1200a and 1200b may include non-volatile memory, such as a flash memory, phase-change RAM (PRAM) and/or resistive RAM (RRAM). The memories 1200a and 1200b may be implemented in the same package as the main processor 1100.

The storage devices 1300a and 1300b may serve as non-volatile storage devices configured to store data regardless of whether power is supplied thereto, and may have larger storage capacity than the memories 1200a and 1200b. The storage devices 1300a and 1300b may respectively include storage controllers (STRG CTRL) 1310a and 1310b and NVMs (Non-Volatile Memories) 1320a and 1320b configured to store data via the control of the storage controllers 1310a and 1310b. Although the NVMs 1320a and 1320b may include flash memories having a two-dimensional (2D) structure or a three-dimensional (3D) V-NAND structure, the NVMs 1320a and 1320b may include other types of NVMs, such as PRAM and/or RRAM.

The storage devices 1300a and 1300b may be physically separated from the main processor 1100 and included in the storage system 1000 or implemented in the same package as the main processor 1100. In addition, the storage devices 1300a and 1300b may have types of solid-state devices (SSDs) or memory cards and may be removably combined with other components of the storage system 1000 through an interface, such as the connecting interface 1480 that will be described below. The storage devices 1300a and 1300b may be devices to which a standard protocol, such as a universal flash storage (UFS), an embedded multi-media card (eMMIC), or a non-volatile memory express (NVMe), is applied.

The optical input device 1410 may capture still images or moving images. The optical input device 1410 may include a camera, a camcorder, and/or a webcam.

The user input device 1420 may receive various types of data input by a user of the storage system 1000, and may include a touch pad, a keypad, a keyboard, a mouse, and/or a microphone.

The sensor 1430 may detect various types of physical quantities, which may be obtained from the outside of the storage system 1000, and convert the detected physical quantities into electric signals. The sensor 1430 may include a temperature sensor, a pressure sensor, an illuminance sensor, a position sensor, an acceleration sensor, a biosensor, and/or a gyroscope sensor.

The communication device 1440 may transmit and receive signals between other devices outside the storage system 1000 according to various communication protocols. The communication device 1440 may include an antenna, a transceiver, and/or a modem.

The display 1450 and the speaker 1460 may serve as output devices configured to respectively output visual information and auditory information to the user of the storage system 1000.

The power supplying device 1470 may convert power supplied from a battery (not shown) embedded in the storage system 1000 and/or an external power source, and supply the converted power to each of components of the storage system 1000.

The connecting interface 1480 may provide connection between the storage system 1000 and an external device, which is connected to the storage system 1000 and capable of transmitting and receiving data to and from the storage system 1000. The connecting interface 1480 may be implemented by using various interface schemes, such as advanced technology attachment (ATA), serial ATA (SATA), external SATA (e-SATA), small computer small interface (SCSI), serial attached SCSI (SAS), peripheral component interconnection (PCI), PCI express (PCIe), NVMe, IEEE 1394, a universal serial bus (USB) interface, a secure digital (SD) card interface, a multi-media card (MMC) interface, an eMMC interface, a UFS interface, an embedded UFS (eUFS) interface, and a compact flash (CF) card interface.

By way of summation and review, a non-volatile memory device may perform various core operations such as a read operation, a program operation, and an erase operation, by adjusting voltages to be applied to a plurality of memory cells. In an initial core operation such as a power-on reset operation, a voltage to be applied to memory cells may be smaller in level than a voltage to be applied thereto in a subsequent or following core operation. A low voltage level may cause the reduction of reliability of the non-volatile memory device. As such, the initial core operation may be managed separately from a subsequent core operation.

As described above, embodiments may provide a memory device for updating a history table, a method of operating the same, and a method of operating a storage device including the same may be provided.

A pre-pulse period may be determined for each memory block based on whether a requested core operation is an initial core operation or a subsequent core operation, and thus a memory device capable of improving the reliability of data and a data processing speed, a method of operating the same, and a method of operating a storage device including the same may be provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of operating a memory device which includes a history table and communicates with a storage controller, the method comprising:
   receiving a first request, indicating a first core operation of a first memory block, from the storage controller;
   determining whether history data of the first memory block have a first value or a second value, with reference to the history table, in response to the first request;
   when it is determined that the history data of the first memory block have the first value, performing the first core operation corresponding to a first type on the first memory block; and
   after performing the first core operation corresponding to the first type on the first memory block, updating the history data of the first memory block in the history table from the first value to the second value.

2. The method as claimed in claim 1, further comprising:
   when it is determined that the history data of the first memory block have the second value, performing the first core operation corresponding to a second type, different from the first type, on the first memory block.

3. The method as claimed in claim 2, wherein the first type defines a first pre-pulse period,
   wherein the second type defines a second pre-pulse period, and
   wherein a length of the first pre-pulse period is longer than a length of the second pre-pulse period.

4. The method as claimed in claim 2, wherein the first request further indicates a selected word line of the first memory block corresponding to the first core operation,
   wherein the first type defines a first pre-pulse period,
   wherein, in the first pre-pulse period, a voltage level of an unselected word line different from the selected word line in the first memory block increases with a first slope,
   wherein the second type defines a second pre-pulse period,
   wherein, in the second pre-pulse period, the voltage level of the unselected word line in the first memory block increases with a second slope, and
   wherein the first slope is greater than the second slope.

5. The method as claimed in claim 2, wherein the first request further indicates a selected word line of the first memory block corresponding to the first core operation,
   wherein the first type defines a first pre-pulse period,
   wherein, in the first pre-pulse period, a voltage level of an unselected word line different from the selected word line in the first memory block increases from a first voltage level to a second voltage level and then decreases from the second voltage level to a third voltage level, wherein the second type defines a second pre-pulse period, wherein, in the second pre-pulse period, the voltage level of the unselected word line in the first memory block increases from the first voltage level to the third voltage level, and wherein the third voltage level is higher than the first voltage level and is lower than the second voltage level.

6. The method as claimed in claim 2, further comprising:

receiving a second request indicating a second core operation of a second memory block from the storage controller;

determining whether history data of the second memory block have the first value or the second value, with reference to the history table, in response to the second request;

when it is determined that the history data of the second memory block have the first value, performing the second core operation corresponding to the first type on the second memory block;

after performing the second core operation corresponding to the first type on the second memory block, updating the history data of the second memory block in the history table from the first value to the second value; and when it is determined that the history data of the second memory block have the second value, performing the second core operation corresponding to the second type on the second memory block.

7. The method as claimed in claim 1, further comprising:

performing a power-on operation or a reset operation of the memory device before receiving the first request, wherein, when the power-on operation or the reset operation is performed in the memory device, all history data managed by the history table are set to the first value.

8. The method as claimed in claim 1, wherein the memory device includes N memory blocks including the first memory block, wherein the history table manages M history data, wherein the updating of the history data of the first memory block in the history table from the first value to the second value after performing the first core operation corresponding to the first type on the first memory block includes:

determining whether a free space is present in the history table;

when it is determined that the free space is absent from the history table, selecting history data having a lowest priority from among the M history data of the history table;

creating an additional free space of the history table by making the selected history data empty; and storing the second value of the history data of the first memory block in the additional free space, and wherein "N" is a natural number, and "M" is a natural number smaller than "N".

9. The method as claimed in claim 8, wherein the selecting of the history data having the lowest priority from among the M history data of the history table when it is determined that the free space is absent from the history table includes:

determining a priority of each of the M history data, based on at least one of update orders of the M history data and reference counts of memory blocks respectively corresponding to the M history data; and selecting the history data having the lowest priority from among the M history data based on the determined priority of each of the M history data.

10. The method as claimed in claim 1, wherein the memory device includes N memory blocks including the first memory block, wherein the history table manages M history data, wherein the updating of the history data of the first memory block in the history table from the first value to the second value after performing the first core operation corresponding to the first type on the first memory block includes:

determining whether a free space is present in the history table; and when it is determined that the free space is present in the history table, storing the second value of the history data of the first memory block in the free space, and wherein "N" is a natural number, and "M" is a natural number smaller than "N".

11. The method as claimed in claim 1, wherein, after a power-on operation or a reset operation of the memory device, when the first memory block is in an untouched state, the history data of the first memory block have the first value, and wherein, after the power-on operation or the reset operation of the memory device, when the first memory block is in a touched state, the history data of the first memory block have the second value.

12. The method as claimed in claim 1, wherein the first core operation indicates a read operation of the first memory block, a program operation of the first memory block, or an erase operation of the first memory block.

13. A method of operating a storage device which includes a memory device including a history table and a storage controller communicating with the memory device, the method comprising:

providing, by the storage controller, a request indicating a core operation of a target memory block of the memory device;

determining, by the memory device, whether history data of the target memory block have a first value or a second value, with reference to the history table, in response to the request;

when it is determined that the history data of the target memory block have the first value, performing, by the memory device, the core operation corresponding to a first type on the target memory block; and after performing the core operation corresponding to the first type on the target memory block, updating, by the memory device, the history data of the target memory block in the history table from the first value to the second value.

14. The method as claimed in claim 13, further comprising:

when it is determined that the history data of the target memory block have the second value, performing, by the memory device, the core operation corresponding to a second type, different from the first type, on the target memory block.

15. The method as claimed in claim 14, wherein the request further indicates a selected word line of the target memory block corresponding to the core operation, wherein the first type defines a first pre-pulse period, wherein the second type defines a second pre-pulse period, and wherein:

a length of the first pre-pulse period is longer than a length of the second pre-pulse period,
a first slope, with which a voltage level of an unselected word line different from the selected word line in the target memory block increases in the first pre-pulse period, is greater than a second slope, with which the voltage level of the unselected word line increases in the second pre-pulse period, or
a voltage level of an unselected word line is overdriven to a voltage higher in level than a read voltage in the first pre-pulse period.

16. The method as claimed in claim 13, further comprising:
providing, by the storage controller, an initial operation request indicating a power-on or reset operation of the memory device before providing the request; and
performing, by the memory device, the power-on or reset operation based on the initial operation request,
wherein, when the power-on or reset operation of the memory device is performed, all history data managed by the history table are set to the first value, and
wherein the storage controller determines whether to perform the reset operation based on an internal operation condition or an external request.

17. A memory device comprising:
a memory cell array including a plurality of memory blocks;
a history table configured to manage history data of at least some of the plurality of memory blocks; and
control logic, wherein the control logic is configured to:
receive a request indicating a core operation of a target memory block of the plurality of memory blocks;
determine whether history data of the target memory block have a first value or a second value, with reference to the history table, in response to the request;
when it is determined that the history data of the target memory block have the first value, update the history data of the target memory block in the history table from the first value to the second value after performing the core operation corresponding to a first type on the target memory block; and
when it is determined that the history data of the target memory block have the second value, perform the core operation corresponding to a second type, different from the first type, on the target memory block.

18. The memory device as claimed in claim 17, wherein the request further indicates a selected word line of the target memory block corresponding to the core operation,
wherein the first type defines a first pre-pulse period, wherein the second type defines a second pre-pulse period, and
wherein:
a length of the first pre-pulse period is longer than a length of the second pre-pulse period,
a first slope, with which a voltage level of an unselected word line different from the selected word line in the target memory block increases in the first pre-pulse period, is greater than a second slope, with which the voltage level of the unselected word line increases in the second pre-pulse period, or
a voltage level of an unselected word line is overdriven to a voltage higher in level than a read voltage in the first pre-pulse period.

19. The memory device as claimed in claim 17, wherein a number of the plurality of memory blocks of the memory cell array is "N",
wherein the history table is further configured to manage a priority of each of M history data, based on at least one of update orders of the M history data and reference counts of memory blocks respectively corresponding to the M history data,
wherein the control logic is further configured to:
when it is determined that the history data of the target memory block have the first value, perform the core operation corresponding to the first type on the target memory block and then determine whether a free space is present in the history table;
when it is determined that the free space is absent from the history table, select history data having a lowest priority from among the M history data of the history table;
create an additional free space of the history table by making the selected history data empty; and
store the second value of the history data of the target memory block in the additional free space, and
wherein "N" is a natural number, and "M" is a natural number smaller than "N".

20. The memory device as claimed in claim 17, wherein the control logic is further configured to:
receive an initial operation request indicating a power-on operation or a reset operation; and
perform the power-on operation or the reset operation based on the initial operation request, and
wherein, when the power-on operation or the reset operation is performed, the history table is further configured to set all history data to the first value under control of the control logic.

* * * * *